US008871595B2

(12) United States Patent
Ramkumar et al.

(10) Patent No.: US 8,871,595 B2
(45) Date of Patent: Oct. 28, 2014

(54) INTEGRATION OF NON-VOLATILE CHARGE TRAP MEMORY DEVICES AND LOGIC CMOS DEVICES

(75) Inventors: Krishnaswamy Ramkumar, San Jose, CA (US); Fredrick Jenne, Sunnyvale, CA (US); Sagy Levy, Zichron-Yoakev (IL)

(73) Assignee: Cypress Semiconductor Corporation, San Jose, CA (US)

( * ) Notice: Subject to any disclaimer, the term of this patent is extended or adjusted under 35 U.S.C. 154(b) by 32 days.

(21) Appl. No.: 13/436,878

(22) Filed: Mar. 31, 2012

(65) Prior Publication Data
US 2013/0178031 A1      Jul. 11, 2013

Related U.S. Application Data

(63) Continuation-in-part of application No. 12/185,751, filed on Aug. 4, 2008, now Pat. No. 8,679,927, which is a continuation of application No. 12/125,864, filed on May 22, 2008, now Pat. No. 8,093,128.

(60) Provisional application No. 60/940,137, filed on May 25, 2007, provisional application No. 60/940,148, filed on May 25, 2007.

(51) Int. Cl.
*H01L 21/8239* (2006.01)

(52) U.S. Cl.
USPC ......................................................... 438/287

(58) Field of Classification Search
USPC .................. 438/264, 268, 287; 257/324, 325, 257/E21.423, E29.309
See application file for complete search history.

(56) References Cited

U.S. PATENT DOCUMENTS

| | | | |
|---|---|---|---|
| 4,843,023 A | 6/1989 | Chiu et al. | |
| 5,404,791 A | 4/1995 | Kervagoret | |
| 5,405,791 A | 4/1995 | Ahmad et al. | |
| 5,573,963 A | 11/1996 | Sung | |
| 5,773,343 A * | 6/1998 | Lee et al. | 438/259 |
| 5,793,089 A | 8/1998 | Fulford et al. | |
| 5,861,347 A | 1/1999 | Maiti et al. | |
| 6,025,267 A | 2/2000 | Pey et al. | |
| 6,074,915 A | 6/2000 | Chen et al. | |

(Continued)

FOREIGN PATENT DOCUMENTS

WO         2011162725 A      12/2011

OTHER PUBLICATIONS

U.S. Appl. No. 12/125,864 "Integration of Non-Volatile Charge Trap Memory Devices and Logic CMOS Devices" William W.C. Koutny Jr et al., filed May 22, 2008; 65 pages.
U.S. Appl. No. 12/185,747 "Integration of Non-Volatile Charge Trap Memory Devices and Logic CMOS Devices," Krishnaswamy Ramkumar et al., filed Aug. 4, 2008; 66 pages.

(Continued)

*Primary Examiner* — Michele Fan

(57) ABSTRACT

An embodiment of a method of integrating a non-volatile memory device into a logic MOS flow is described. Generally, the method includes: forming in a first region of a substrate a channel of a memory device from a semiconducting material overlying a surface of the substrate, the channel connecting a source and a drain of the memory device; forming a charge trapping dielectric stack over the channel adjacent to a plurality of surfaces of the channel, wherein the charge trapping dielectric stack includes a blocking layer on a charge trapping layer over a tunneling layer; and forming a MOS device over a second region of the substrate.

20 Claims, 22 Drawing Sheets

(56) References Cited

U.S. PATENT DOCUMENTS

| | | | |
|---|---|---|---|
| 6,153,543 | A | 11/2000 | Chesire et al. |
| 6,174,774 | B1 | 1/2001 | Lee |
| 6,277,683 | B1 | 8/2001 | Pradeep et al. |
| 6,429,081 | B1 | 8/2002 | Doong et al. |
| 6,518,113 | B1 * | 2/2003 | Buynoski ................ 438/217 |
| 6,599,795 | B2 | 7/2003 | Ogata |
| 6,730,566 | B2 | 5/2004 | Niimi et al. |
| 6,787,419 | B2 | 9/2004 | Chen et al. |
| 6,818,558 | B1 | 11/2004 | Rathor et al. |
| 6,903,422 | B2 | 6/2005 | Goda et al. |
| 6,946,349 | B1 * | 9/2005 | Lee et al. ................ 438/275 |
| 7,015,100 | B1 | 3/2006 | Lee et al. |
| 7,045,424 | B2 | 5/2006 | Kim et al. |
| 7,098,154 | B2 | 8/2006 | Yoneda |
| 7,172,940 | B1 | 2/2007 | Chen et al. |
| 7,238,990 | B2 | 7/2007 | Burnett et al. |
| 7,250,654 | B2 | 7/2007 | Chen et al. |
| 7,253,046 | B2 | 8/2007 | Higashi et al. |
| 7,262,457 | B2 | 8/2007 | Hsu et al. |
| 7,544,565 | B2 | 6/2009 | Kwak et al. |
| 7,588,986 | B2 | 9/2009 | Jung |
| 7,646,041 | B2 * | 1/2010 | Chae et al. ................ 257/204 |
| 7,692,246 | B2 * | 4/2010 | Dreeskornfeld et al. ..... 257/353 |
| 7,714,379 | B2 | 5/2010 | Lee |
| 7,723,789 | B2 | 5/2010 | Lin et al. |
| 7,879,738 | B2 | 2/2011 | Wang |
| 7,927,951 | B2 * | 4/2011 | Kim et al. ................ 438/267 |
| 7,999,295 | B2 | 8/2011 | Lai et al. |
| 8,008,713 | B2 | 8/2011 | Dobuzinsky et al. |
| 8,063,434 | B1 * | 11/2011 | Polishchuk et al. ......... 257/324 |
| 8,283,261 | B2 | 10/2012 | Ramkumar |
| 8,318,608 | B2 | 11/2012 | Ramkumar et al. |
| 2003/0227049 | A1 | 12/2003 | Sakakibara |
| 2004/0067619 | A1 | 4/2004 | Niimi et al. |
| 2004/0071030 | A1 | 4/2004 | Goda et al. |
| 2004/0129986 | A1 | 7/2004 | Kobayashi et al. |
| 2004/0207002 | A1 * | 10/2004 | Ryu et al. ................ 257/315 |
| 2004/0227196 | A1 | 11/2004 | Yoneda |
| 2005/0056892 | A1 * | 3/2005 | Seliskar ................ 257/348 |
| 2005/0116279 | A1 * | 6/2005 | Koh ................ 257/314 |
| 2005/0186741 | A1 | 8/2005 | Roizin et al. |
| 2005/0224866 | A1 | 10/2005 | Higashi et al. |
| 2005/0266637 | A1 | 12/2005 | Wang |
| 2005/0275010 | A1 * | 12/2005 | Chen et al. ................ 257/315 |
| 2006/0081331 | A1 | 4/2006 | Campian |
| 2006/0202263 | A1 | 9/2006 | Lee |
| 2006/0226490 | A1 | 10/2006 | Burnett et al. |
| 2006/0281331 | A1 | 12/2006 | Wang |
| 2007/0066087 | A1 | 3/2007 | Jung |
| 2007/0215940 | A1 * | 9/2007 | Ligon ................ 257/341 |
| 2007/0272971 | A1 * | 11/2007 | Lee et al. ................ 257/321 |
| 2008/0048237 | A1 | 2/2008 | Iwata |
| 2008/0057644 | A1 | 3/2008 | Kwak et al. |
| 2008/0087942 | A1 * | 4/2008 | Hsu et al. ................ 257/324 |
| 2008/0290398 | A1 * | 11/2008 | Polishchuk et al. ......... 257/324 |
| 2008/0293254 | A1 | 11/2008 | Ramkumar et al. |
| 2008/0293255 | A1 | 11/2008 | Ramkumar |
| 2009/0011609 | A1 | 1/2009 | Ramkumar et al. |
| 2009/0179253 | A1 * | 7/2009 | Levy et al. ................ 257/324 |
| 2009/0206385 | A1 * | 8/2009 | Kim et al. ................ 257/319 |
| 2010/0252877 | A1 | 10/2010 | Nakanishi et al. |
| 2011/0248332 | A1 | 10/2011 | Levy et al. |

OTHER PUBLICATIONS

U.S. Appl. No. 12/185,751 "Integration of Non-Volatile Charge Trap Memory Devices and Logic CMOS Devices," Krishnaswamy Ramkumar et al., filed Aug. 4, 2008; 66 pages.

Application No. PCT/US08/06597 "Integration of Non-Volatile Charge Trap Memory Devices and Logic CMOS Devices," Filed on May 23, 2008; 50 pages.

International Search Report for International Application No. PCT/US13/32777 dated Jun. 20, 2013; 2 pages.

USPTO Non Final Rejection for U.S. Appl. No. 12/125,864 dated Nov. 17, 2010; 19 pages.

USPTO Non Final Rejection for U.S. Appl. No. 12/185,747 dated Aug. 6, 2009; 15 pages.

USPTO Notice of Allowance for U.S. Appl. No. 12/125,864 dated Apr. 19, 2011; 11 pages.

USPTO Notice of Allowance for U.S. Appl. No. 12/185,747 dated Nov. 17, 2010; 8 pages.

USPTO Notice of Allowance for U.S. Appl. No. 12/185,751 dated Jun. 25, 2013; 9 pages.

USPTO Notice of Allowance for U.S. Appl. No. 12/185,751 dated Nov. 2, 2012; 7 pages.

Written Opinion of the International Searching Authority for International Application No. PCT/13US/32777 dated Jun. 20, 2013; 7 pages.

International Search Report for International Application No. PCT/US08/06597 dated Aug. 19, 2008; 2 pages.

SIPO 2 month Office Action for Application No. 200880000919.3 dated Feb. 28, 2012; 9 pages.

SIPO 2 month Office Action for Application No. 200880000919.3 dated Oct. 9, 2012; 6 pages.

SIPO Office Action for Application No. 200880000919.3 dated Feb. 23, 2011; 10 pages.

The Written Opinion of the International Searching Authority for International Application No. PCT/US08106597 mailed Aug. 19, 2008; 5 pages.

USPTO Final Rejection for U.S. Appl. No. 12/125,864 dated Jul. 1, 2010; 18 pages.

USPTO Final Rejection for U.S. Appl. No. 12/185,747 dated Feb. 25, 2010; 12 pages.

USPTO Non-Final Rejection for U.S. Appl. No. 12/125,864 dated Apr. 27, 2009; 17 pages.

USPTO Non-Final Rejection for U.S. Appl. No. 12/125,864 dated Nov. 13, 2009; 19 pages.

USPTO Non-Final Rejection for U.S. Appl. No. 12/185,747 dated Jul. 1, 2010; 12 pages.

USPTO Non-Final Rejection for U.S. Appl. No. 12/185,751 dated Oct. 4, 2009; 19 pages.

USPTO Notice of Allowance for U.S. Appl. No. 12/125,864 dated Oct. 31, 2011; 6 pages.

USPTO Notice of Allowance for U.S. Appl. No. 12/185,747 dated Feb. 13, 2012; 6 pages.

USPTO Notice of Allowance for U.S. Appl. No. 12/185,747 dated Jul. 11, 2011; 6 pages.

USPTO Notice of Allowance for U.S. Appl. No. 12/185,751 dated Feb. 24, 2010; 7 pages.

USPTO Requirement for Restriction for U.S. Appl. No. 12/185,747 dated Apr. 20, 2009; 7 pages.

USPTO Requirement for Restriction for U.S. Appl. No. 12/185,751 dated Apr. 20, 2009; 7 pages.

* cited by examiner

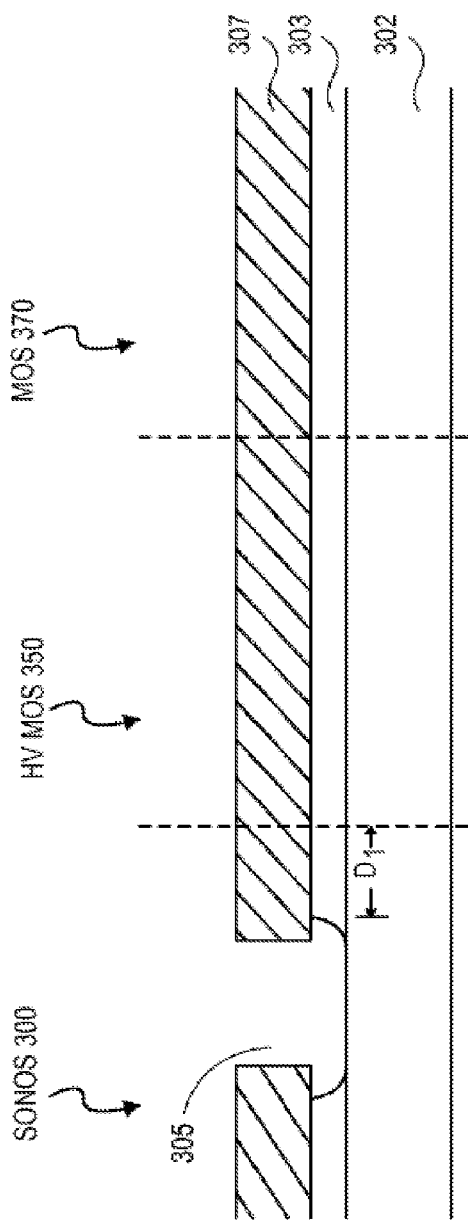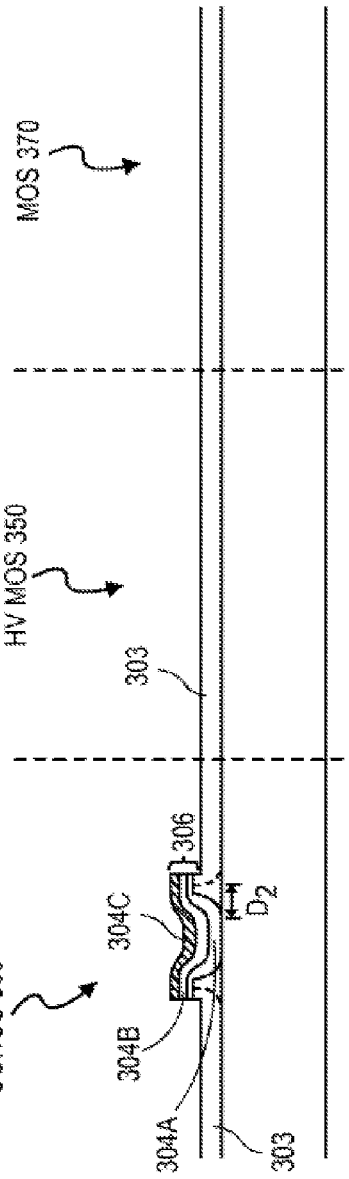

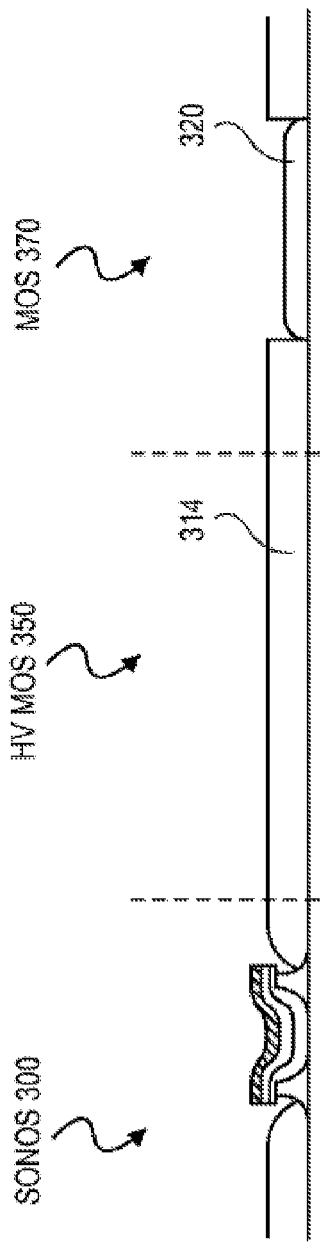
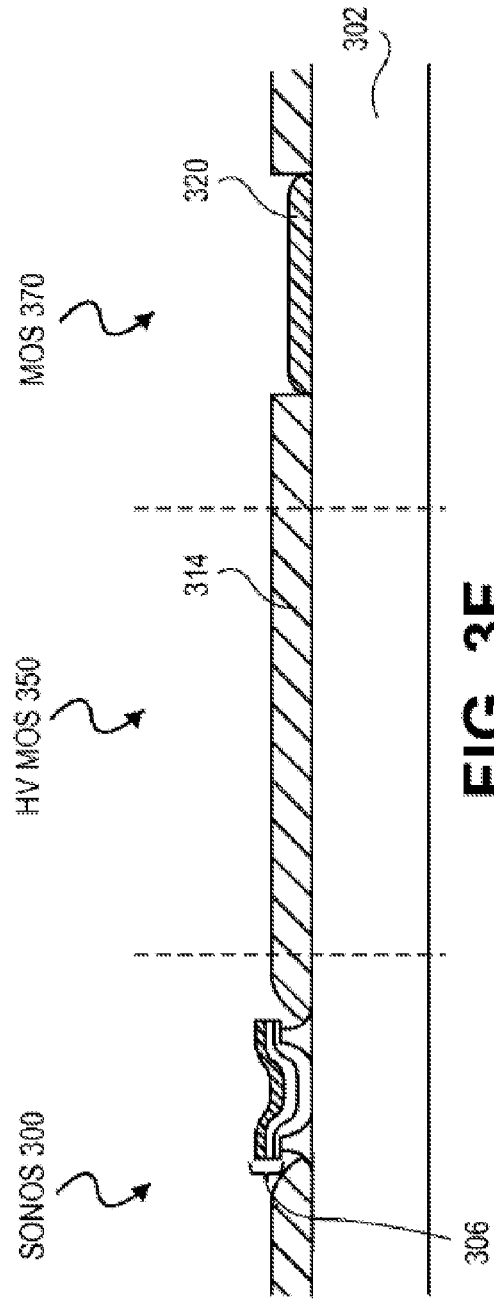

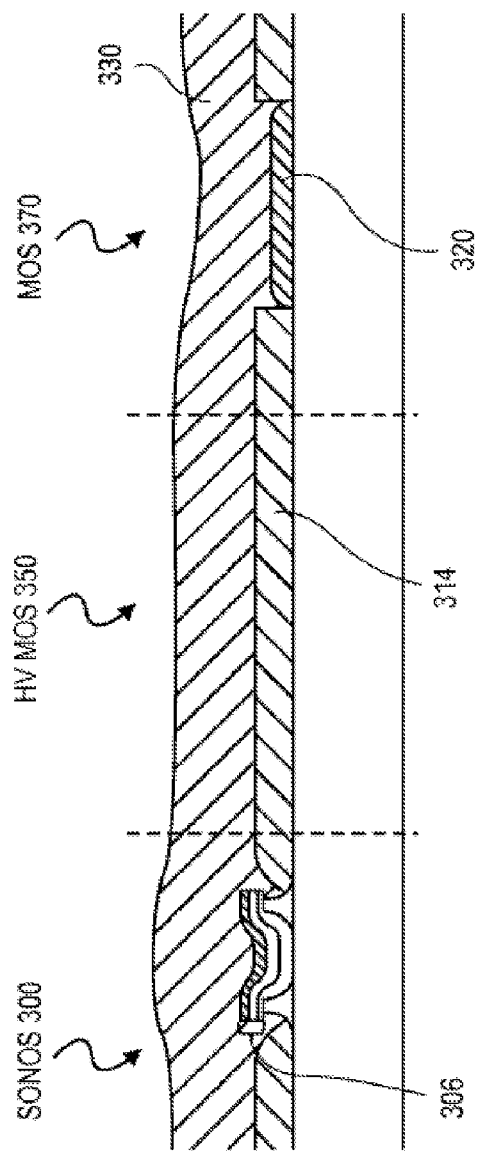
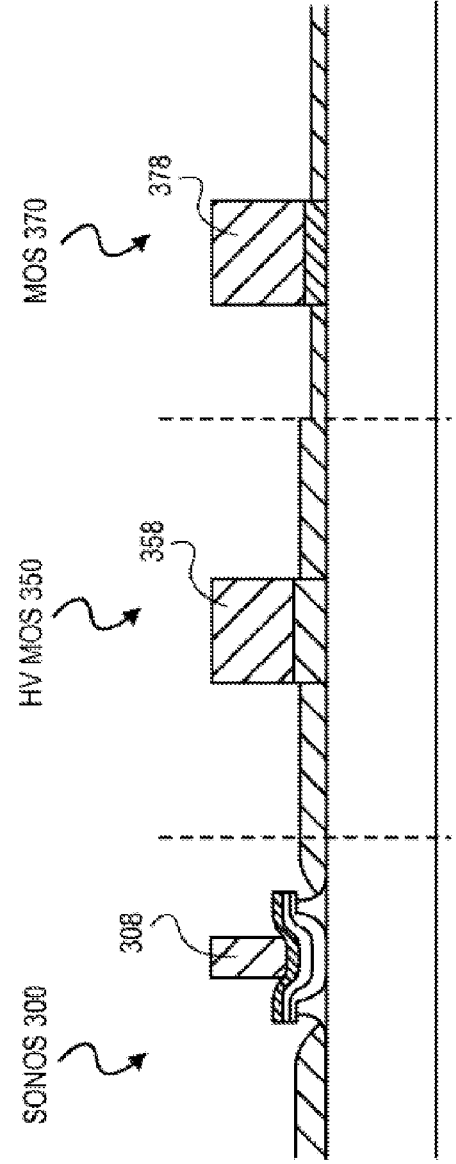
FIG. 3G
FIG. 3H

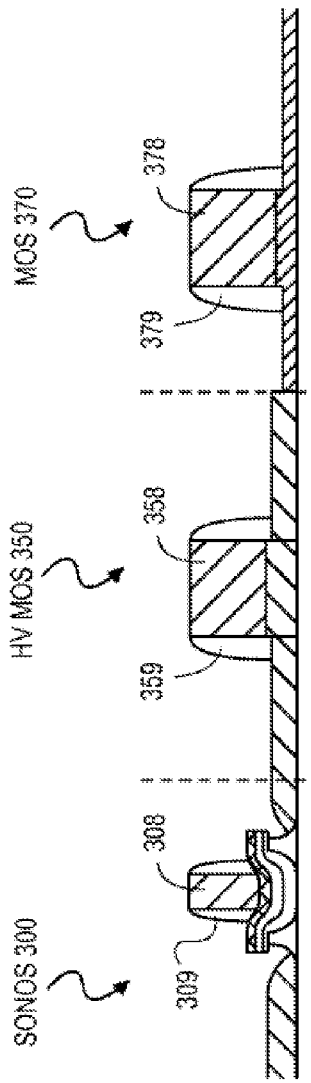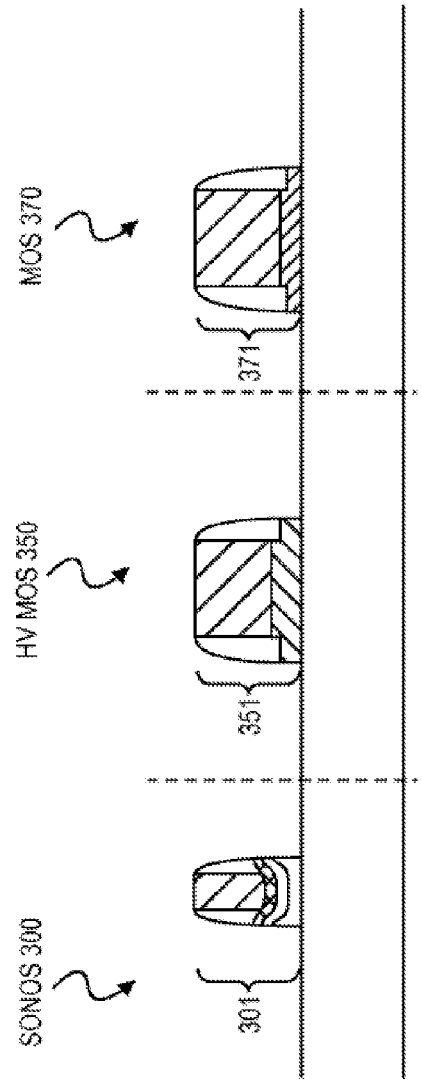

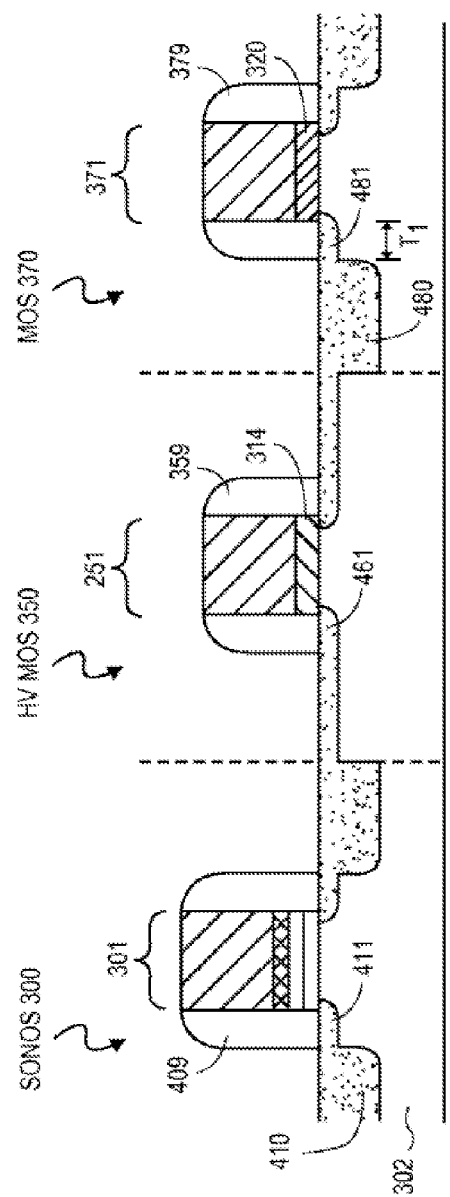
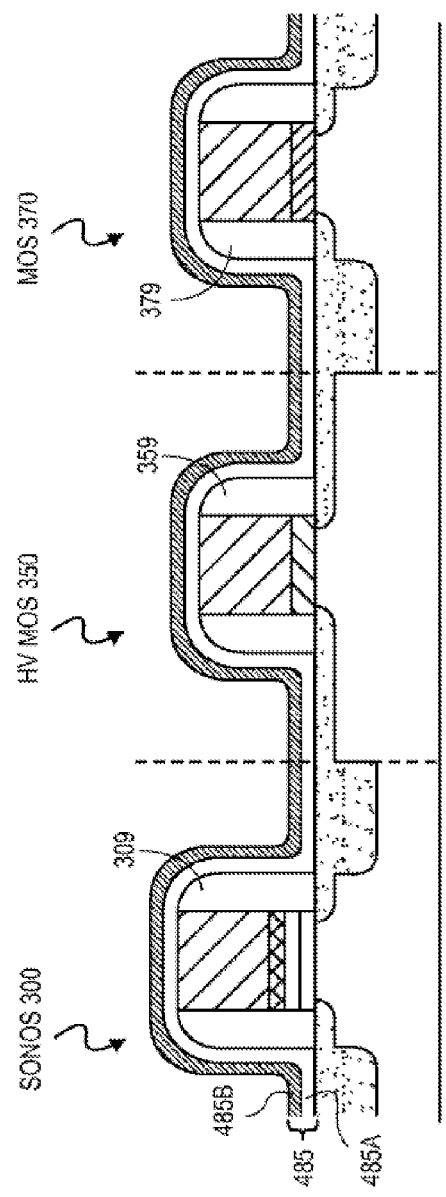
FIG. 4A
FIG. 4B

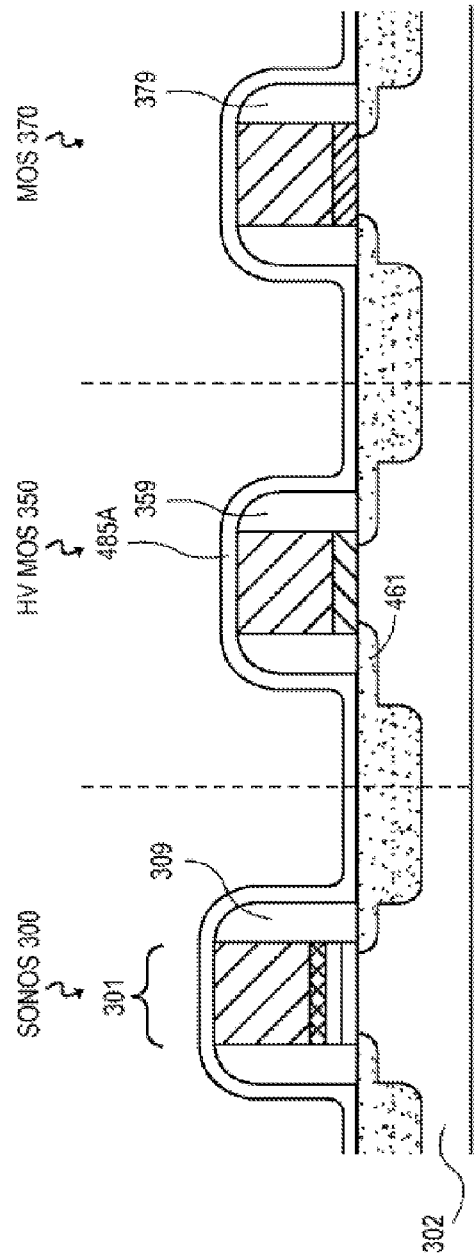
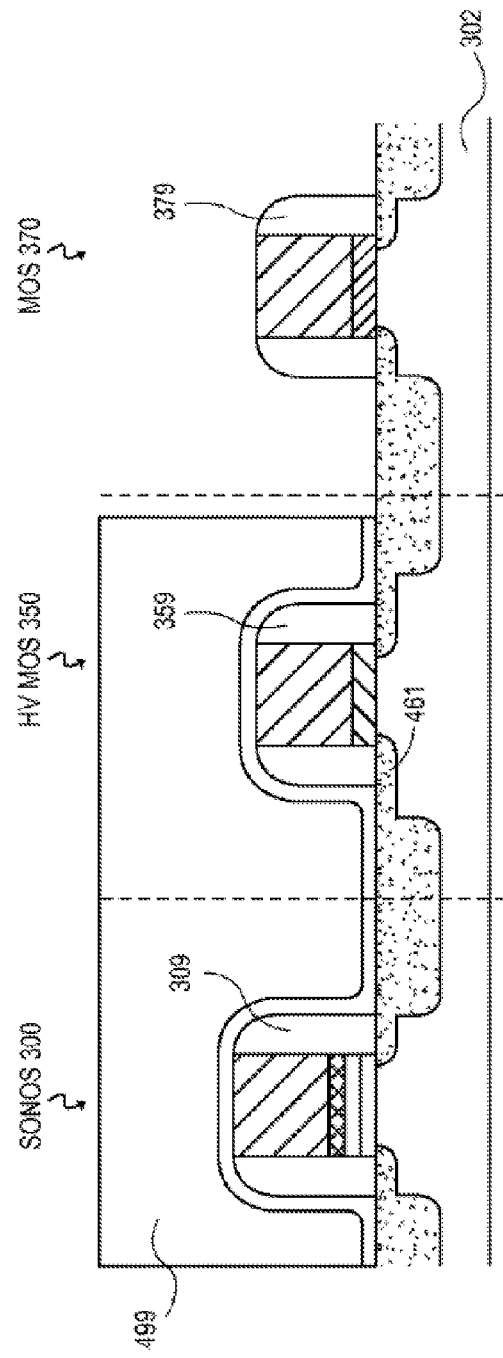
FIG. 4E
FIG. 4F

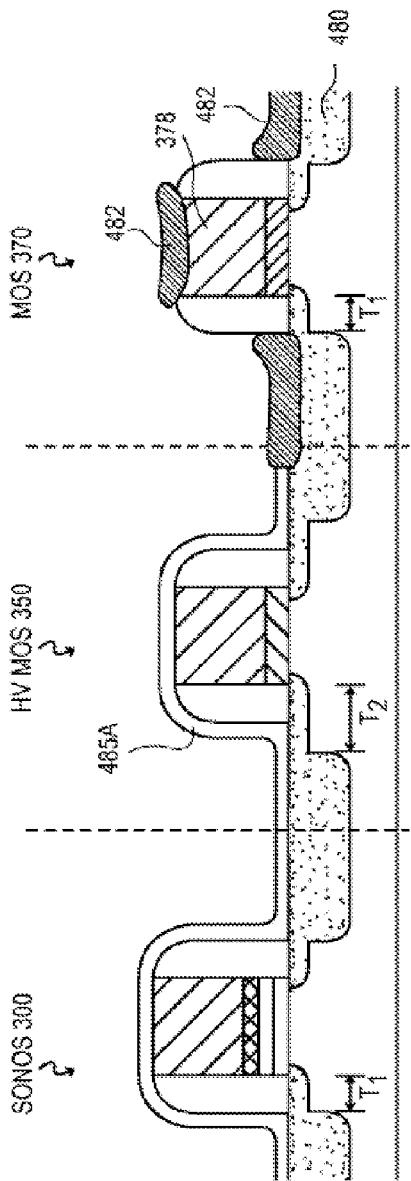
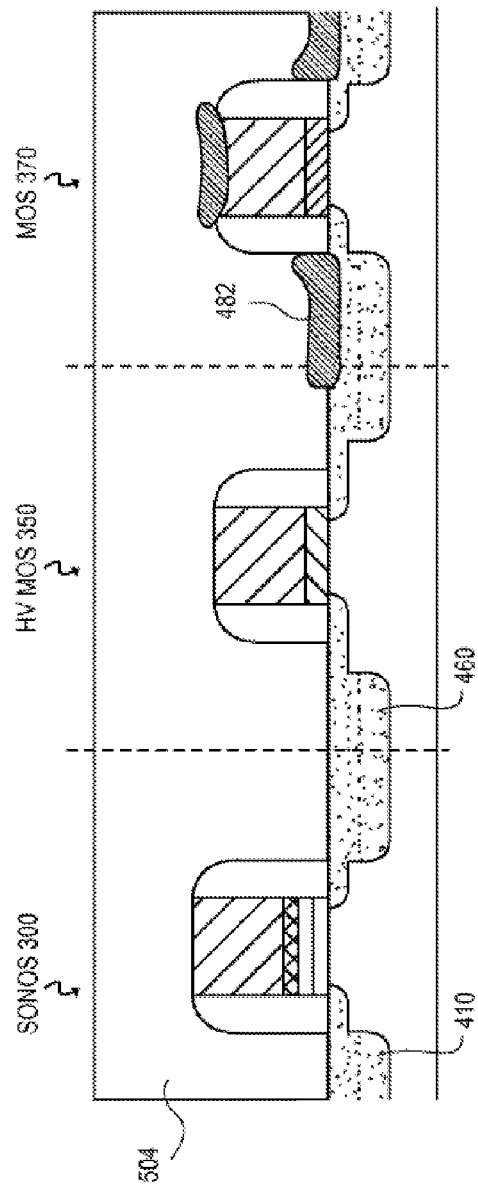

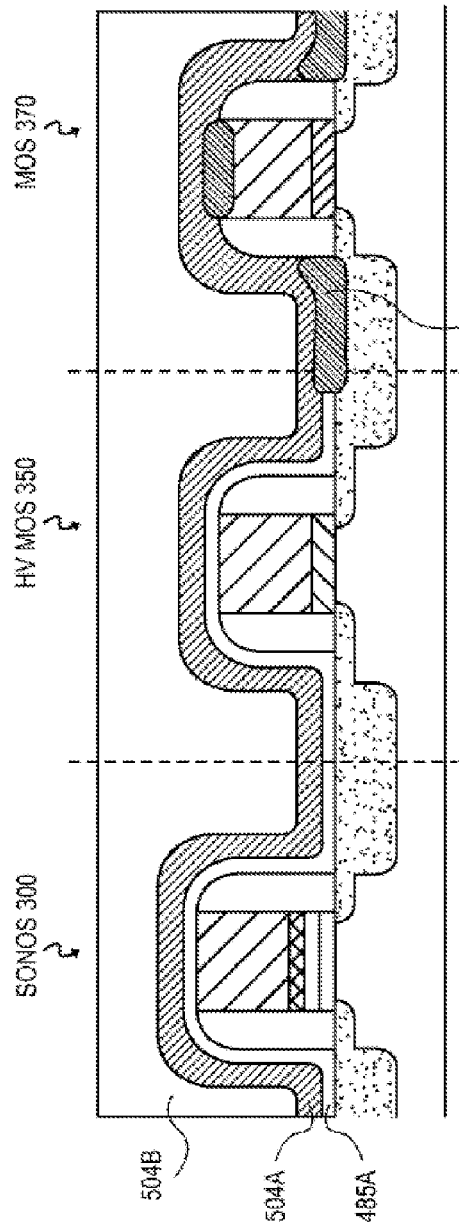
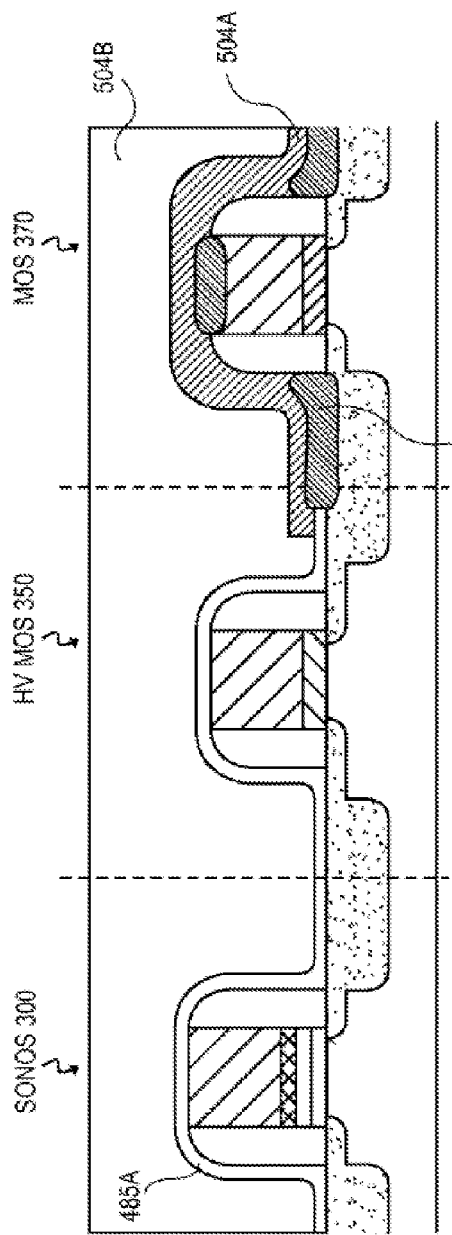
FIG. 6A
FIG. 6B

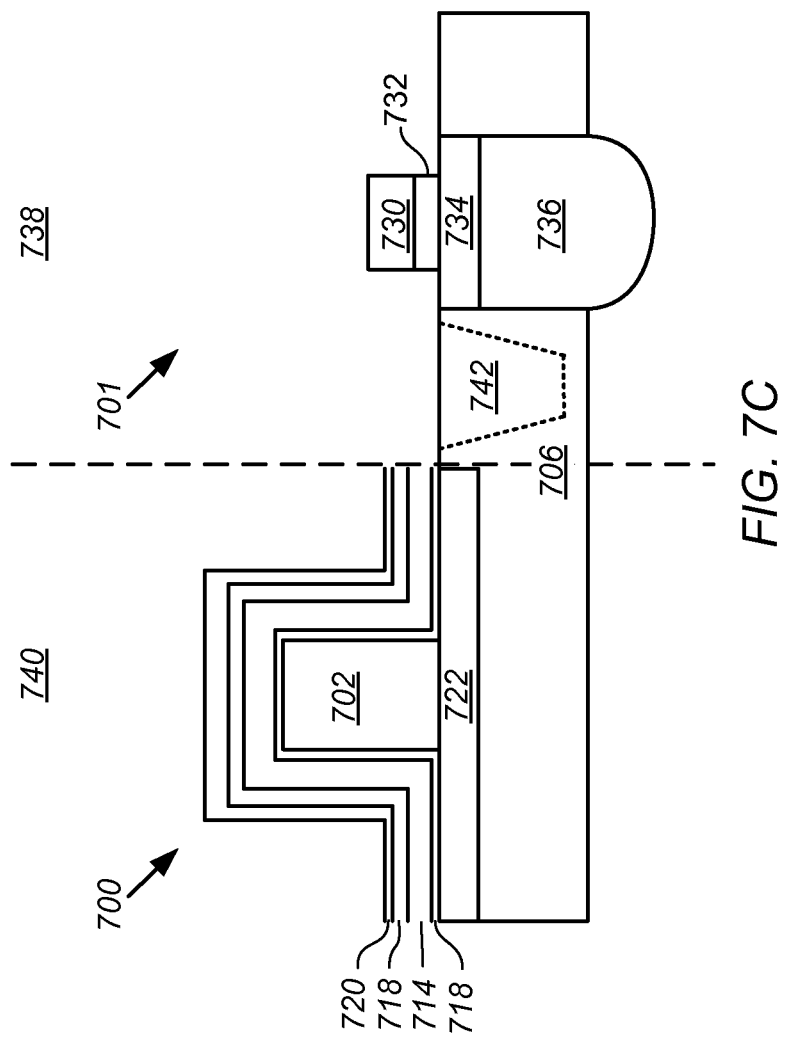

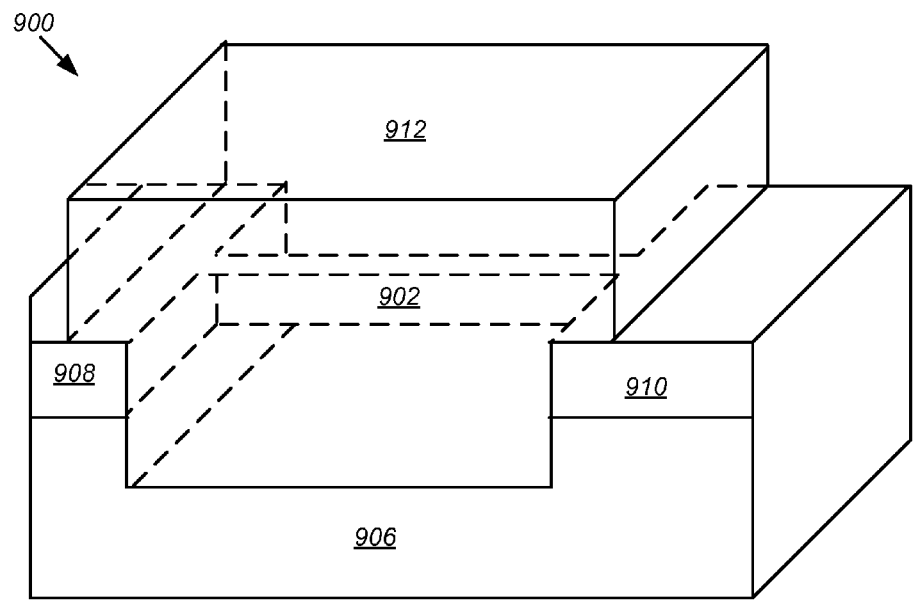
FIG. 9A
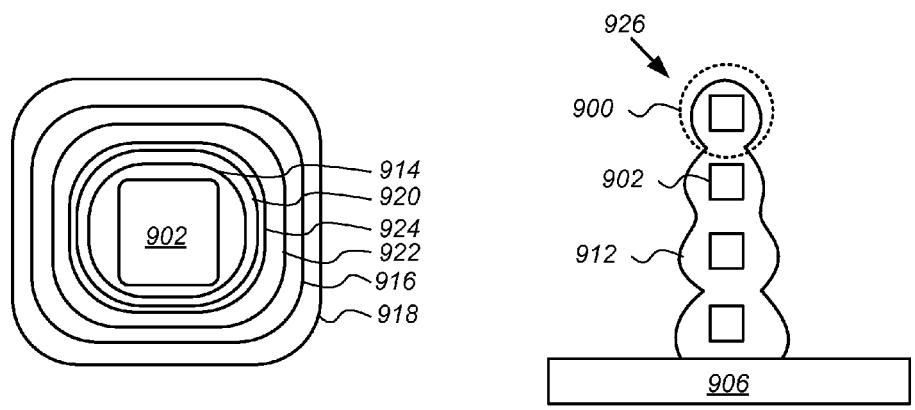
FIG. 9B
FIG. 9C

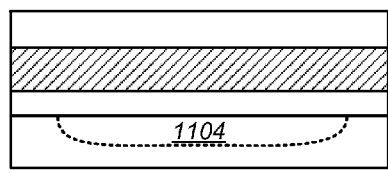
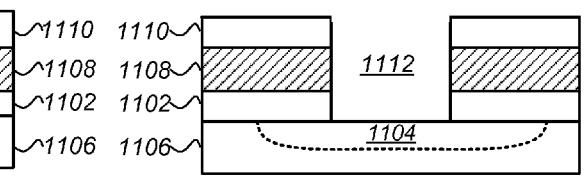
FIG. 11A  FIG. 11B
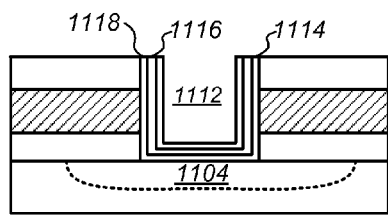
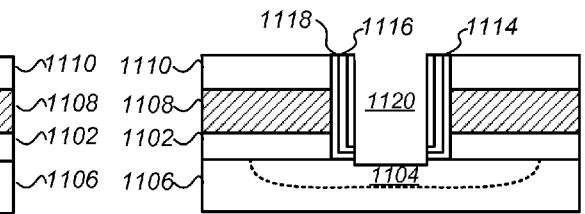
FIG. 11C  FIG. 11D
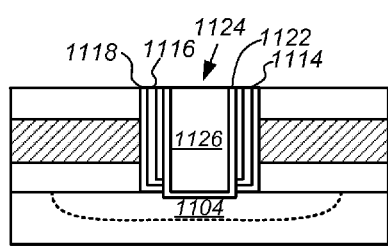
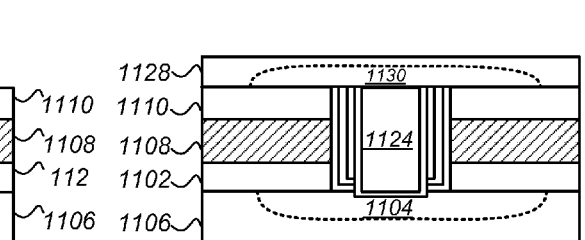
FIG. 11E  FIG. 11F

INTEGRATION OF NON-VOLATILE CHARGE TRAP MEMORY DEVICES AND LOGIC CMOS DEVICES

CROSS-REFERENCE TO RELATED APPLICATIONS

This application is a continuation-in-part of co-pending U.S. application Ser. No. 12/185,751, filed Aug. 4, 2008, which is a continuation of U.S. application Ser. No. 12/125,864, filed May 22, 2008, now U.S. Pat. No. 8,093,128, issued Jan. 10, 2012, which claims the benefit of priority under 35 U.S.C. 119(e) to U.S. Provisional Patent Application Ser. No. 60/940,148, filed on May 25, 2007, and U.S. Provisional Patent Application Ser. No. 60/940,137, filed May 25, 2007, all of which are incorporated by reference herein.

TECHNICAL FIELD

The invention is in the field of semiconductor devices, more specifically pertaining to non-volatile charge trap memory devices integrated with logic CMOS devices.

BACKGROUND

Feature scaling in integrated circuits is an enabler of more capable electronic devices. Scaling to smaller features increases densities of functional units in a given form factor as well as increasing device processing speeds. Device scaling, however, is not without issue. For example, optimizing the performance of smaller devices becomes increasingly difficult. This is particularly true for the scaling of nonvolatile charge trap memory devices, in which data retention and sensing becomes increasingly difficult as the devices are scaled.

In addition to device scaling, system-on-a-chip type architecture also increases electronic device functionality. Such architecture may incorporate, for example, a memory device on the same substrate as a logic device to reduce the cost of fabrication as well as increase communication bandwidth between the memory and logic devices.

The integration of these dissimilar devices in a system-on-a-chip architecture is problematic because the fabrication process for the logic MOS device may hamper the fabrication process of the memory device and vice versa. Such a dilemma may occur, for example, when integrating the logic MOS gate oxide process module with the fabrication of a dielectric stack for a memory device. Also, channel and well implant processing for the logic devices may also be detrimental to the memory device dielectric stack while formation of the latter may be problematic for the former. As still another example, silicided contacts, which are advantageous for a logic transistor, may adversely affect a nonvolatile charge trap memory device.

Also, operation of a non-volatile memory device may require application of relatively high voltages (HV), typically of at least 10 V. However, the conventional processes employed in fabrication of a scaled logic device are typically optimized for device operation at 5 V or less. Such low voltage devices may lack a sufficiently high breakdown voltage to interface directly with a memory device.

BRIEF DESCRIPTION OF THE DRAWINGS

Embodiments of the present invention are illustrated by way of example, and not limitation, in the figures of the accompanying drawings in which:

FIG. 3A illustrates a cross-sectional view representing operations in the formation of a semiconductor structure in which a SONOS channel implant is performed while a screening oxide is over the MOS and HV MOS regions of a substrate, in accordance with an embodiment of the present invention;

FIG. 3B illustrates a cross-sectional view representing operations in the formation of a semiconductor structure in which a SONOS charge trapping dielectric stack is formed and the MOS and HV MOS regions are cleaned in preparation for forming a first gate insulator layer, in accordance with an embodiment of the present invention;

FIG. 3E illustrates a cross-sectional view representing operations in the formation of a semiconductor structure in which a second gate insulator layer is formed in the MOS region, in accordance with an embodiment of the present invention;

FIG. 3F illustrates a cross-sectional view representing operations in the formation of a semiconductor structure in which the SONOS oxide blocking layer, the HV MOS gate insulator layer and the MOS gate insulator layer are nitrided, in accordance with an embodiment of the present invention;

FIG. 3G illustrates a cross-sectional view representing operations in the formation of a semiconductor structure in which a gate layer is deposited, in accordance with an embodiment of the present invention;

FIG. 3H illustrates a cross-sectional view representing operations in the formation of a semiconductor structure in which a gate electrode is formed in accordance with an embodiment of the present invention;

FIG. 3I illustrates a cross-sectional view representing operations in the formation of a semiconductor structure in which a sidewall spacer is formed in accordance with an embodiment of the present invention; and FIG. 3J illustrates a cross-sectional view representing operations in the formation of a semiconductor structure in which charge trap dielectric and gate dielectric is removed adjacent to sidewall spacers to complete definition of gate stacks, in accordance with an embodiment of the present invention.

FIG. 4A illustrates a cross-sectional view representing operations in the formation of a semiconductor structure having a SONOS gate stack with adjacent sidewall spacers as wells as HV MOS and MOS device gate stacks with adjacent sidewall spacers on a single substrate, in accordance with an embodiment of the present invention;

FIG. 4B illustrates a cross-sectional view representing operations in the formation of a semiconductor structure in which a multi-layered liner is deposited over the SONOS and logic devices, in accordance with an embodiment of the present invention;

FIG. 4E illustrates a cross-sectional view representing operations in the formation of a semiconductor structure in which the disposable spacer is removed from the SONOS and logic devices, in accordance with an embodiment of the present invention;

FIG. 4F illustrates a cross-sectional view representing operations in the formation of a semiconductor structure in which the bottom layer of the multilayered liner is removed from the MOS device but retained over the SONOS and HV MOS devices, in accordance with an embodiment of the present invention;

FIG. 4G illustrates a cross-sectional view representing operations in the formation of a semiconductor structure in which a silicide is formed on the MOS device but blocked by the bottom layer of the multi-layered liner over the SONOS and MOS devices, in accordance with an embodiment of the present invention;

FIG. 5 illustrates a cross-sectional view representing operations in the formation of a semiconductor structure in which an interlayer dielectric (ILD) layer is formed on the sidewalls of the sidewall spacers adjacent to the MOS SONOS and HV MOS gate stacks, in accordance with an embodiment of the present invention;

FIG. 6A illustrates a cross-sectional view representing operations in the formation of a semiconductor structure in which a stress inducing ILD layer is formed on the sidewall spacers adjacent to the MOS gate stack and formed on a bottom layer of the multi-layered liner over the SONOS and HV MOS gate stacks, in accordance with an embodiment of the present invention;

FIG. 6B illustrates a cross-sectional view representing operations in the formation of a semiconductor structure in which a low-stress ILD layer is formed on a bottom layer of the multi-layered liner covering the sidewall spacers adjacent to the SONOS and HV MOS gate stacks and formed on a stress inducing ILD layer over the MOS device, in accordance with an embodiment of the present invention;

FIG. 7C illustrates a cross-sectional view of a vertical string of non-planar multigate devices of FIG. 7A;

FIGS. 9A and 9B illustrate a non-planar multigate device including a split charge-trapping region and a horizontal nanowire channel;

FIG. 9C illustrates a cross-sectional view of a vertical string of non-planar multigate devices of FIG. 9A;

FIG. 11A through 11F illustrate a gate first scheme for fabricating the non-planar multigate device of FIG. 10A.

DETAILED DESCRIPTION

Figure 1:
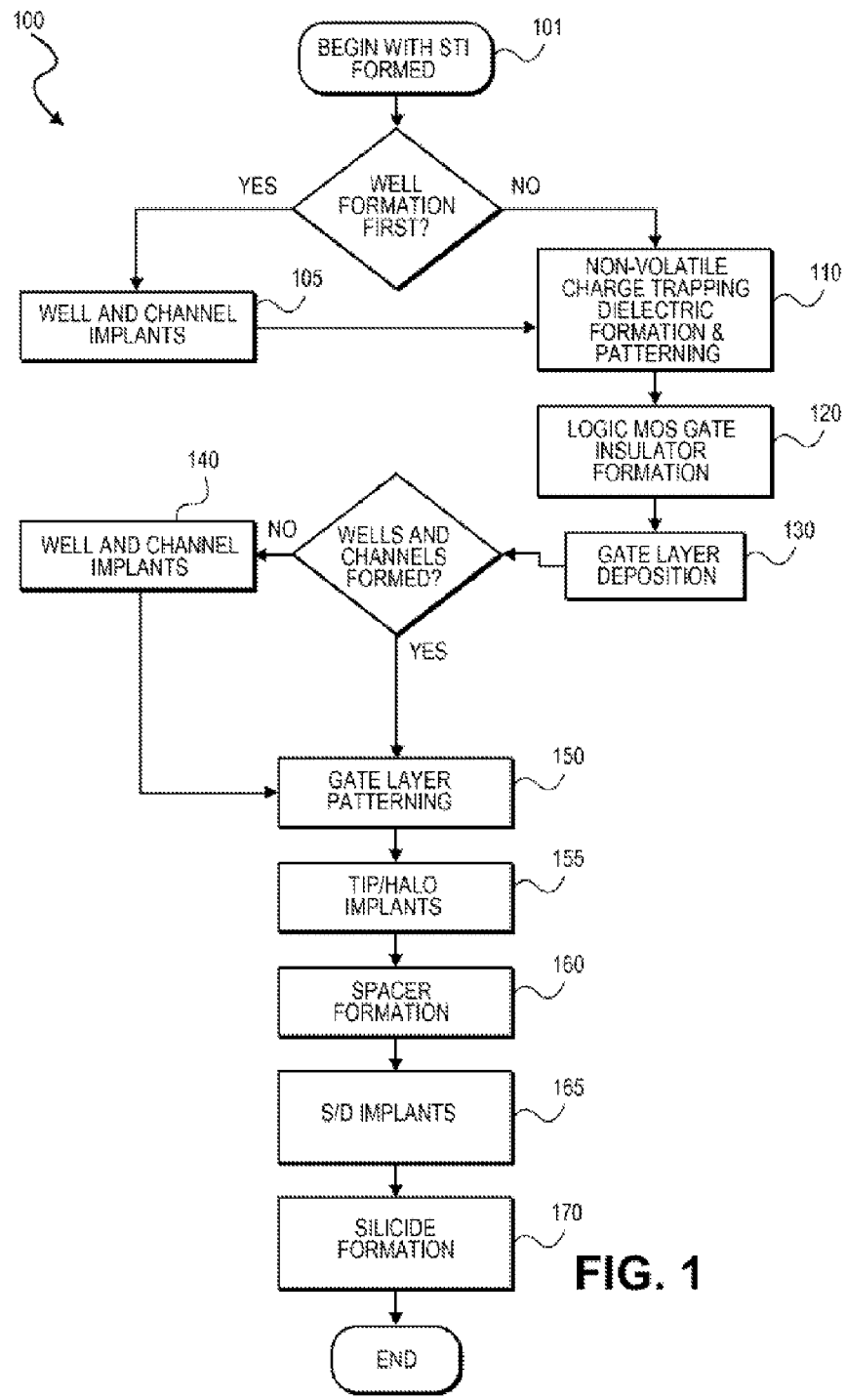
FIG. 1 illustrates a flow diagram depicting sequences of particular modules employed in the fabrication process of a non-volatile charge trap memory device integrated with a logic MOS fabrication process, in accordance with particular embodiments of the present invention.

Embodiments of a non-volatile charge trap memory device integrated with logic devices are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor design and fabrication techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

In an embodiment, a nonvolatile charge trap dielectric stack, such as a SONOS stack, is formed in a first region of a substrate after at least some of the well and channel implants of logic MOS devices are formed in a second region of the substrate.

In another embodiment, a nonvolatile charge trap dielectric stack is formed prior to any logic MOS gate oxidation processing. In one such embodiment, a SONOS stack is removed from the second region of the substrate, and a thermal oxidation forms a first gate insulator layer over the second region of the semiconductor substrate and thermally reoxidizes a blocking layer of the SONOS stack. In a further embodiment, a nitridation process nitridizes the first gate insulator layer and the blocking layer simultaneously.

In another embodiment, a nonvolatile charge trap memory device without silicide contacts is integrated with a logic device having silicide contacts. Such an embodiment may advantageously improve the reliability of the nonvolatile charge trap memory device by reducing silicide-related stress in the memory device.

In a further embodiment, at least one of the logic devices has a longer lightly doped source and drain (i.e. offset source and drain) than at least another one of the logic devices to allow for HV operation (e.g. breakdown voltage greater than 10 V). In one such embodiment, wherein the logic devices include a HV PMOS device and an-type MOS (NMOS) device, the NMOS device has a smaller source and drain offset than does the HV PMOS device. In another such embodiment, wherein the logic devices include a HV PMOS device and a PMOS device, the PMOS device has a smaller source and drain offset than does the HV PMOS. In a particular embodiment, the lightly doped source and drain of the HV MOS device is a length greater than the thickness of a sidewall spacer adjacent to a sidewall of a gate stack of the MOS device.

In another embodiment, a multi-layered liner is employed to offset the HV MOS source and drain and also protect the nonvolatile charge trap memory device from silicidation. In one such embodiment, wherein the multi-layered liner includes at least a top and bottom layer, a top layer is formed into a disposable spacer to offset the HV MOS source and drain and the bottom layer is used to mask the nonvolatile charge trap memory device during a silicidation of one or more of the logic devices. In another embodiment, the bottom layer is additionally used to mask the HV MOS device during silicidation of one or more of the logic devices. In a particular embodiment, the disposable spacer is removed selectively to the bottom layer of the multi-layered liner after the HV MOS source and drain are implanted. In a further embodiment, the bottom layer of the multi-layered liner is retained over the nonvolatile charge trap memory device as an ILD layer, covered with another ILD layer and then etched through during contact formation. In another embodiment, the bottom layer of the multi-layered liner is retained over the nonvolatile charge trap memory device and the HV MOS device as an ILD layer. In one such embodiment, the stress in the bottom layer of the multi-layered liner is of opposite sign than that of a stress inducing ILD layer deposited over the bottom liner layer. In one particular embodiment, the bottom layer of the multi-layered liner induces compressive stress on the underlying device while the stress inducing ILD layer induces tensile stress on the underlying device.

FIG. 1 illustrates a flow diagram depicting sequences of particular modules employed in the fabrication process 100 of a non-volatile charge trap memory device integrated with a logic MOS device, in accordance with particular embodiments of the present invention. The methods begin with formation of isolation regions at module 101. Isolation regions may be formed by any conventional technique, such as, but not limited to shallow trench isolation (STI) or local oxidation of silicon (LOCOS).

After the isolation regions are formed at module 101 the process flow may either proceed with well and/or channel implants at module 105 or delay the formation of the wells and/or channels until after formation of the non-volatile charge trapping dielectric stack and/or gate layer deposition.

In an advantageous embodiment, a non-volatile charge trapping dielectric stack is formed on a first region of a substrate at module 110 after at least some of the well and channel implants for the logic MOS transistors are formed at module 105. It has been found that approximately 0.5 nm of silicon dioxide may be removed during a conventional postimplant resist strip process. The amount removed is greater if the silicon dioxide is a deposited oxide rather than a thermally grown oxide or if the silicon dioxide received an implant (e.g. 1.0 nm of silicon dioxide removed/strip process). Because there is typically a number of well and channel implants in a CMOS process flow, between 1.5 nm and 2.5 nm of silicon dioxide may be removed prior to performing the RCA cleans in preparation for a logic MOS gate dielectric. Similarly, the well and channel implant strips may also etch a non-volatile charge trapping dielectric stack (which may include silicon dioxide). While the nominal etch rate of the implant strip processes is quite small, it has also been found to form pin holes, or localized defects in the non-volatile charge trapping dielectric stack which may reduce the charge retention of a SO NOS-type memory device. Thus, inserting the module forming the non-volatile charge trapping dielectric stack after the well and channel implant modules of a logic CMOS flow results in the least disruption to the non-volatile charge trapping dielectric stack.

To include a logic MOS transistor on the same substrate as the nonvolatile charge trap device, a gate insulator layer is formed on the second region of the substrate at module 120. As will be discussed in more detail subsequently, this sequence of forming the non-volatile charge trapping dielectric layer prior to forming the MOS gate insulator layer advantageously utilizes the subsequent thermal treatments forming the MOS gate insulator layer to improve the quality of the nonvolatile charge trapping dielectric stack, particularly a blocking layer. Logic MOS transistor degradation from thermal processing associated with formation of the nonvolatile charge trapping dielectric layers is also avoided by forming the non-volatile charge trapping dielectric stack prior to forming the logic MOS gate insulator layer.

Following module 120, a gate layer is deposited over both the MOS gate insulator layer and over the non-volatile charge trapping dielectric stack at module 130. Next, if the well and/or channel implants were not performed at module 105, the well and/or channel implants may be performed at module 140, after module 130. In such an embodiment, the well and channel implants may advantageously dope the gate layer formed at module 130 in addition to forming the wells and/or channels. With the well and channels in place (either as a result of module 105 or module 140), the gate layer may be then be patterned into gate electrodes at module 150. Gate electrode patterning may occur simultaneously for both a non-volatile charge trap memory device in the first region of the substrate and a MOS device in the second region of the substrate.

With the gate stacks of the two devices substantially complete at module 150, tip and/or HALO implants may be formed for all devices at module 155 and sidewall spacers formed for all devices at module 160. Source and drain implants may then be formed for all devices at operation 165. As described elsewhere herein, a multi-layered liner and disposable spacer process may be performed at these operations to provide a high voltage CMOS transistor. Then at operation 170, a silicide process may be performed to substantially complete the front end device fabrication. As further described herein, a multi-layered liner may be utilized to provide silicidation of logic CMOS without silicidation of the non-volatile charge trap memory device (i.e. selective silicidation). Backend metallization, as is conventional in the art, may then be performed to fabricate an integrated semiconductor structure comprising a non-volatile charge trap memory device and a MOS device on a single substrate.

Figure 2A:
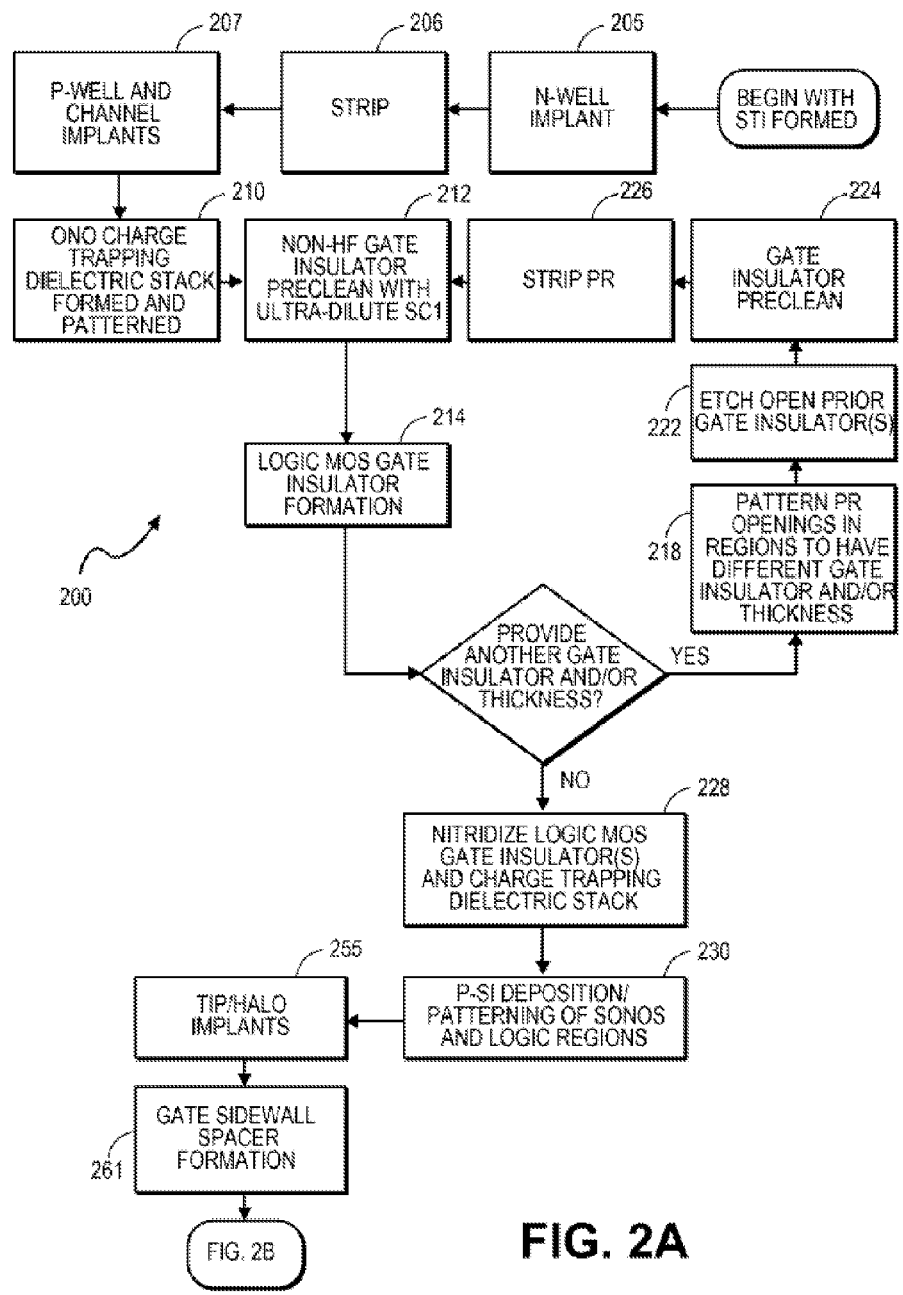
FIGS. 2A and 2B illustrate flow diagrams depicting sequences of particular operations in the integration of logic MOS gate fabrication with a nonvolatile charge-trapping dielectric stack for implementing certain modules illustrated in FIG. 1, in accordance with particular embodiments of the present invention.

FIG. 2A illustrates a flow diagram depicting fabrication process 200 including particular modules integrating formation of a charge-trapping dielectric stack with logic MOS gate insulator formation, in accordance with particular embodiments of the present invention. Thus, FIG. 2A depicts particular process modules employed in certain implementations of the modules 105, 110, 120 and 130 of FIG. 1. FIGS. 3A through 3J further illustrate a cross-section of a SONOS memory device, a high voltage MOS device and a low voltage MOS device as the modules in the process flow of FIG. 2A are implemented.

FIG. 28 illustrates a flow diagram depicting fabrication process 201 including particular modules integrating formation of a charge-trapping dielectric stack with a high voltage MOS transistor and with selective contact silicidation, in accordance with particular embodiments of the present invention. Thus, FIG. 28 depicts particular modules employed in certain implementations of the modules 155, 160, 165 and 170 of FIG. 1. FIGS. 4A through 68 further illustrate a cross-section of the non-volatile charge trap memory device, a high voltage MOS device and a low voltage MOS device as the modules in the process flow of FIG. 28 are implemented.

Referring to FIG. 2A, process 200 begins with STI formed in a substrate. The substrate may be a bulk substrate comprised of a single crystal of a material which may include, but is not limited to, silicon, germanium, silicon/germanium or a III-V compound semiconductor material. In another embodiment, the substrate is comprised of a bulk layer with a top epitaxial layer. In a specific embodiment, the bulk layer is comprised of a single crystal of a material which may include, but is not limited to, silicon, germanium, silicon/germanium, a III-V compound semiconductor material and quartz, while the top epitaxial layer is comprised of a single crystal layer which may include, but is not limited to, silicon, germanium, silicon/germanium and a III-V compound semiconductor material. In another embodiment, the substrate is comprised of a top epitaxial layer on a middle insulator layer which is above a lower bulk layer. The top epitaxial layer is comprised of a single crystal layer which may include, but is not limited to, silicon (i.e. to form a silicon-on-insulator (SOI) semiconductor substrate), germanium, silicon/germanium and a III-V compound semiconductor material. The insulator layer is comprised of a material which may include, but is not limited to, silicon dioxide, silicon nitride and silicon oxy-nitride. The lower bulk layer is comprised of a single crystal which may include, but is not limited to, silicon, germanium, silicon/germanium, a III-V compound semiconductor material and quartz.

At module 205, a first well implant, such an n-well implant is performed. Module 205 will typically include forming a patterned photomask on a screening sacrificial dielectric layer, such as a silicon dioxide layer. The n-well implant is then performed in a region of the substrate, such as the region for MOS transistor 370. In certain embodiments, then-well implant includes implanting a phosphorus species at concentrations and energies conventional for MOS devices. A single n-well implant may be performed for PMOS transistors, PMOS HV transistors and p-type SONOS devices.

At module 206, a dry and/or wet strip is performed to remove the well implant photomask. Conventional plasma strips, such as oxygen, forming gas, and the like may be employed. Similarly, conventional wet strips, such as piranha clean and ozone clean may be used. Because the charge trapping dielectric stack of the non-volatile memory device has not yet been formed, the silicon dioxide etch rate of the strip module 206 is of little concern.

A module 207, a p-well implant is performed. Here too, conventional implant species, such as boron, may be employed at typical doses and energies. The p-well implant may be, but is not necessarily, a patterned implant such as the n-well implant of module 205. If patterned, any of those strip processes of module 206 may be repeated. In one embodiment, the p-well implant is performed in another area of the substrate, adjacent to an n-well region in preparation for an NMOS transistor. In alternative embodiments, the p-well implant is an unmasked implant.

Any number of channel implants may also be performed at module 207 to adjust threshold voltages for specific device applications. For example, an n-channel implant may be performed in a region of the substrate where a NMOS transistor channel will be located, thereby setting a threshold voltage. The n-channel implant may be of any conventional species (e.g. BF2), dose and energy for a particular device type. A channel implant for a non-volatile charge trap memory device may also be performed in a first region of the substrate 302, such as the region for SONOS device 300 of FIG. 3A. Similarly, a channel implant for a high voltage MOS transistor may be performed in the substrate region of HV MOS transistor 350. A p-channel implant may likewise be performed, for example in the substrate region of MOS transistor 3 70.

In the exemplary embodiment depicted in FIG. 3A, in preparation for a SONOS channel implant, a window 305 defined by photoresist 307 is formed in the sacrificial dielectric layer 303. The window 305 may be of sub-micron dimension, for example, approximately 0.2 urn in length and width. In one such an embodiment, an oxygen plasma clean is performed to descum photoresist residue from the corners of window 305. A sacrificial silicon oxide layer, which in one exemplary implementation is between 10 and 30 nm thick, may then be removed with a buffered oxide etchant (B0E) containing a surfactant, again to ensure window 305 is opened completely.

The isotropic etch of the screening sacrificial dielectric layer 303 can be expected to undercut the photoresist 307 by an amount D1•The undercut amount D1 is important when window 305 is proximate to a logic device, such as in the region for HV MOS transistor 350 because logic device implants performed through the screening sacrificial dielectric layer 303 may have a different implant profile within the undercut region. Therefore, certain embodiments downsize the dimensions of window 305. For example a 0.2 urn drawn size may be downsized to 0.18 urn to compensate for an undercut of 0.01 μm on a side. In further embodiments, because the undercut of window 305 may become very close to an adjacent logic device, critical layer lithography tools are employed to reduce mis-registration tolerances.

After formation of the window 305, the channel implant may be performed and the photoresist 307 may be stripped. With the well and channel implants formed, an anneal may be performed to complete module 207. In one such embodiment, a rapid thermal anneal is performed after implanting both the n-well and p-well. The rapid thermal anneal may be any known in the art to be suitable for MOS transistor applications.

With the well and channel implants completed, the non-volatile charge trapping dielectric stack is formed at module 210. Referring back to FIG. 2A, a non-volatile charge trapping dielectric stack, such as an ONO charge trapping dielectric stack is then formed and patterned to remain only in memory cell areas at module 210. In one embodiment depicted in FIG. 38, a ONO charge trapping dielectric stack 306 is comprised of a tunneling layer 304A, a charge trapping layer 3048 and a blocking layer 304C. The tunneling layer 304A may be any material and have any thickness allowing charge carriers to tunnel into the charge-trapping layer under a high gate bias condition while maintaining a suitable barrier to leakage under conditions of low gate bias. In certain embodiments, tunneling layer 304A is a commonly known dielectric layer, such as silicon dioxide (Si02), a silicon oxynitride (SiOxNy(Hz)), a silicon dioxide that is subsequently nitridized, or a stack dielectric made of silicon dioxide and silicon nitride (Si3N4) or silicon oxynitride, having a physical thickness of between about 1.5 nm and 3.0 nm. In another embodiment, tunneling layer 304A is comprised of a dielectric layer having a dielectric constant greater than that of silicon nitride which may include, but is not limited to, hafnium oxide, zirconium oxide, hafnium silicate, hafnium oxy-nitride, hafnium zirconium oxide and lanthanum oxide.

The charge trapping layer 304B of the SONOS device 300 may further include any commonly known charge trapping material and have any thickness suitable to store charge and, modulate the threshold voltage of the devices. In certain embodiments charge trapping layer 304B is silicon nitride, silicon-rich silicon nitride, or silicon oxynitride. In one particular embodiment, the trapping layer 304B has a non-uniform stoichiometry across the thickness of trapping layer. For example, the charge trapping layer 304B may further include at least two silicon oxynitride layers having differing compositions of silicon, oxygen and nitrogen. In one particular embodiment, a bottom oxynitride within charge trapping layer 304B has a first composition with a high silicon concentration, a high oxygen concentration and a low nitrogen concentration to provide an oxygen-rich oxynitride.

As used herein, the terms "oxygen-rich" and "silicon-rich" are relative to a stoichiometric silicon nitride, or "nitride," commonly employed in the art having a composition of (Si3N4) and with a refractive index (RI) of approximately 2.0. Thus, "oxygen-rich" silicon oxynitride entails a shift from stoichiometric silicon nitride toward a higher wt % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher wt % of silicon with less oxygen than an "oxygen-rich" film. A silicon-rich silicon oxynitride film is therefore more like silicon and the RI is increased toward the 3.5 RI of pure silicon.

The bottom silicon oxynitride may have a physical thickness between 2.5 nm and 4.0 nm corresponding to an EOT of between 1.5 nm and 5.0 nm. The charge trapping layer 304B may further include a top silicon oxynitride with a high silicon concentration, a high nitrogen concentration and a low oxygen concentration to produce a silicon-rich silicon oxynitride. This second silicon oxynitride may have a physical thickness of 4.0 to 6.0 nm for a charge trapping layer 304B with a net physical thickness of 9 to 11 nm. The oxygen-rich stoichiometry of the first silicon oxynitride, being more like silicon dioxide relative to silicon nitride, provides a good quality interface with tunneling layer 304A. In one such embodiment, the composition of the oxygen-rich oxynitride results in an RI in the range of 1.7 and 1.9 and preferably about 1.8. In a further embodiment, the composition of the silicon-rich oxynitride results in an RI in the range of 1.8 and 2.0 and preferably about 1.9.

In one embodiment, multiple silicon nitride or silicon oxynitride charge trapping layers are formed in a low pressure CVD process using a silicon source, such as silane (SiH4), dichlorosilane (SiH2Cl2), tetrachlorosilane (SiCl4) or Bis-TertiaryButylAmino Silane (BTBAS), a nitrogen source, such as N2, NH3, N2O or nitrogen trioxide (N03), and an oxygen-containing gas, such as 0 2 or N20.

In one exemplary implementation, a silicon oxynitride charge trapping layer can be deposited over a tunneling layer by placing the substrate in a deposition chamber and the flow rate of ammonia (NH3) gas and nitrous oxide (N20) as mixed with a silicon precursor, such as dichlorosilane (SiH2Cl2), to provide the desired gas ratios to form first an oxygen-rich oxynitride film and then a silicon-rich oxynitride film. Just as the terms "oxygen-rich" and "silicon-rich" are relative to a stoichiometric Si3N4 film, formation of these films may also be characterized based on the 3:1 volumetric flow rate ratio, SiH2Cl2:NH3, commonly employed to produce a stoichiometric (Si3N4) with a CVD method. The oxygen-rich oxynitride film is therefore formed with a relatively higher volumetric flow rate of oxidizer (e.g. N20) than used for the silicon-rich oxynitride film while the both the oxygen-rich and silicon-rich oxynitride films are formed with a relatively higher volumetric flow rate of silicon precursor (e.g. SiH2Cl2).

In a specific batch process embodiment, an oxygen-rich oxynitride film is formed by introducing a process gas mixture including N2O, NH3 and SiH2Cl2, while maintaining the chamber at a pressure approximately in the range of 5-500 mTorr, and maintaining substrate 400 at a temperature approximately in the range of 700-850° C., for a period approximately in the range of 2.5-20 minutes. In an exemplary embodiment, the process gas mixture includes N20 and NH3 at a high volumetric flow rate ratio of about 1:1 to about 3:1 N20:NH3 while the SiH2Cl2 to NH3 is also at a high volumetric flow rate ratio from about 3.5:1 to 8:1 SiH2Cl2: NH3. In a preferred embodiment, the N2O:NH3 ratio is about 2:1. while the SiH2Cl2:NH3 is at a ratio of about 6:1. In certain embodiments, the gases are introduced at a flow rate approximately in the range of 5-200 standard cubic centimeters per minute (sccm).

In a further embodiment, a silicon-rich oxynitride film is then formed by introducing a process gas mixture including N20, NH3 and SiH2Cl2, while maintaining the chamber at a pressure approximately in the range of 5-500 mTorr, and maintaining substrate 400 at a temperature approximately in the range of 700-850° C., for a period approximately in the range of 2.5-20 minutes in a batch furnace. The process gas mixture includes N20 and NH3 at a volumetric flow rate ratio from about 1:8 to about 1:4 (N20:NH3) with SiH2Ch and NH3 at a volumetric flow rate ratio from about 3.5:1 to 5:1 (SiH2Ch:NH3). In a preferred embodiment, the N20 and NH3 are provided at a volumetric flow rate ratio of about 1:5 (NzO:NH3) while the SiH2Ch and NH3 are at a volumetric flow rate ratio of about 4:1 (SiH2Ch:NH3). In certain embodiments, the gases are introduced at a flow rate approximately in the range of 5 to 200 seem.

Completing the ONO charge trapping dielectric stack 306, the blocking layer 304C of the SONOS device 300 may be any commonly known material with any thickness suitable to maintain a barrier to charge leakage without significantly decreasing the capacitance of the gate stack. In one embodiment, blocking layer 304C comprises a dielectric layer having a higher dielectric constant than silicon nitride which may include, but is not limited to, hafnium oxide, zirconium oxide, hafnium silicate, hafnium oxy-nitride, hafnium zirconium oxide and lanthanum oxide. In another embodiment, the blocking layer 304C is silicon dioxide layer, silicon oxynitride layer, or a silicon dioxide and silicon nitride stack, with a physical thickness between about 3.0 nm and about 5.0 nm.

Blocking layer 304C can be formed by any suitable means including, for example, thermal oxidation or deposition with CVD techniques. In a preferred embodiment, the blocking layer is a deposited film formed with a high-temperature CVD process. Generally, the deposition process involves providing a silicon source, such as SiH4, SiH2Ch, or SiCl4 and an oxygen-containing gas, such as Oz or N20 in a deposition chamber at a pressure of from about 50 mT to about 1000 mT, for a period of from about 10 minutes to about 120 minutes while maintaining the substrate at a temperature of from about 650° C. to about 850° C. Preferably, the blocking layer is deposited sequentially in the same processing tool employed to form the charge trapping layer(s) 304B. More preferably, the blocking layer is formed in the same processing tool as is both the charge trapping layer(s) 304B and the tunneling layer 304A without removing the substrate between operations.

With the ONO charge trapping dielectric layers 304A, 304B and 304C formed, they are then patterned into the ONO charge trapping dielectric stack 306 in the SONOS device 300, as depicted in FIG. 3B. Conventional lithography and etching techniques may be employed to remove the charge trapping dielectric layers from other regions of the substrate, such as the HV MOS region 350 and MOS region 370. In a particular embodiment, a combination of dry and wet etch is performed to achieve a good stack sidewall profile. In one such embodiment, an inorganic spin-on anti-reflective coating (ARC), the blocking layer 304C, and the dielectric layers 304A and 3048 are dry etched, with the dry etch process stopping on the sacrificial dielectric layer 303. In a subsequent wet etch operation, an etchant, such as 80E, is employed to clear sacrificial dielectric layer 303. Here too, as discussed elsewhere herein in reference to opening of window 305 of FIG. 3A, the isotropic wet etch may undercut the masked region. In this instance, undercutting the ONO charge trapping dielectric stack 306, as denoted by the dashed line in FIG. 38, reduces the overlap between ONO charge trapping dielectric stack 306 and the sacrificial dielectric layer 303 to the amount D2•If the overlay of the ONO charge trapping dielectric stack 306 and the window 305 is not adequate (e.g. D2 becomes zero) the substrate region of SONOS device 300 may be rendered non-functional by subsequent processes. Thus, for this reason too, the dimensions and alignment of window 305 and ONO charge trapping dielectric stack 306 are important.

Upon completion of module 210, the method of FIG. 2A proceeds to module 212, wherein the substrate 302 is cleaned of organic residues left on wafer from photoresist strip or etch by-products in preparation for the formation of a gate insulator layer in the HV MOS region 350 and MOS region 370. In the particular embodiment depicted in FIG. 2A, module 212 includes a non-HF gate insulator preclean. Hydrofluoric acid (HF) cleans, while conventionally performed in logic CMOS processes to remove any native or chemical oxides from the substrate 302 prior to forming a gate insulator, are disadvantageous when non-volatile charge trapping dielectric layers have already been formed and remain substantially unprotected.

Conventional HF-based gate insulator pre-cleans will etch or otherwise degrade the quality of the ONO charge trapping dielectric stack 306, particularly when the stack includes a CVD formed blocking layer 304C. Therefore, in the depicted embodiment, module 212 includes cleaning operations which are substantially free of HF. For such embodiments, the substrate 302 may retain a native or chemical oxide after the cleaning operations employed in the module 212. It should be appreciated, that this concern of HF-based cleans attacking thin and critical dielectric layers is not present for standard logic MOS processes and is also not to be found in flash memory processes that protect such layers (e.g. tunnel oxide layer of flash memory device), with a polysilicon floating gate layer prior to the HF-based MOS gate insulator pre-clean.

The non-HF pre-clean of module 212 may include cleaning regimes known in the art to remove organic residues, such as, but not limited to piranha cleans, ozone cleans, and plasma cleans comprising 0 2 or forming gas. The non-HF pre-clean may also include a RCA Standard Clean I (SCI) clean comprising a mixture of water, hydrogen peroxide and ammonium hydroxide ($H_zO$:$H_zO_z$:$NH_4OH$). It will be appreciated that a blocking layer 304C formed by CVD may be particularly susceptible to dielectric etchants because, for example, a deposited oxide blocking layer is typically of poorer quality than a thermally formed oxide layer. The poorer quality, be it from film stress, porosity, stoichiometry or otherwise, is associated with elevated etch rates relative to thermally grown dielectric layers. Therefore, the processes employed in the pre-clean module 212 should not be too aggressive.

For example, SCI mixtures in logic CMOS are typically employed at a ratio of 5:I:I $H_2O$:$H_2O_2$:$NH_4OH$, however it has been found that this chemistry may etch a CVD silicon dioxide blocking layer 304C at an average rate of approximately 0.2 to 0.3 nm/minute. Perhaps more of a concern than this nominal etch rate, is the capacity for the SCI chemistry to roughen the blocking layer 304C. This roughness may be characterized with RMS roughness measurements. Also a concern associated with the SCI chemistry is formation of pinhole defects in the top oxide which may be found at a low enough density to remain undetectable with RMS roughness measurements but nonetheless decrease the quality of the blocking layer 304C. It has been found these difficulties are avoidable or at least substantially mitigated by employing an ultra-dilute SCI clean at module 212. An ultra-dilute SCI is substantially more dilute than 5:I:I. For example, in one advantageous embodiment the ultra-dilute SCI comprises approximately 0.00 I % $NH_4OH$, and 0.1% $H_2O_2$ in $H_2O$. Following the ultra-dilute SCI, the non-HF pre-clean depicted in module 2I2, may further include an RCA Standard Clean 2 (SC2) clean comprising a mixture of $H_2O$:$H_2O_2$:HCl in a ratios known in the art.

In an alternative embodiment, the non-HF pre-clean of module 212 may include an ozonated water cleaning regime. For such an embodiment, the SC 1 clean may be replaced by the ozonated water to remove the organics and etch residues. With elimination of the SCI clean, few metals will be left on the substrate surface and the SC2 is therefore unnecessary.

Following the non-HF pre-clean of module 212, a logic MOS gate insulator layer may be formed on the substrate 302. The logic MOS gate insulator layer may comprise any of the dielectric materials described elsewhere herein for any of the charge trapping dielectric layers 304A, 3048 and 304C, but in a particular embodiment, includes a thermally grown oxide as the gate insulator layer 314 of FIG. 3C. For particular embodiments employing a silicon substrate 302, the gate insulator layer 314, thermally grown, comprises silicon oxygen bonds. As noted elsewhere herein, the integrated process flow depicted in FIG. 1 advantageously sequences the formation of the ONO charge trapping dielectric stack 306 prior to formation of the logic MOS gate insulator so that formation of the logic MOS gate insulator with a thermal process has the advantage of additionally serving to reoxidize the ONO charge trapping dielectric stack 306. Reoxidation of the blocking layer 304C may have the effect of densifying a CVD formed blocking oxide layer and improving the quality of the blocking oxide and thereby improving non-volatile charge trap memory device performance (e.g. reduced back injection). The reoxidation of the blocking layer 304C is depicted by the addition of field lines in FIG. 3C. In a further embodiment, formation of the gate insulator layer 314 may further oxidize or reoxidize a portion or all of the charge trapping layer, such as a portion or all of the charge trapping layer 3048 shown in FIG. 3C, to achieve a graded band gap in the charge trapping layer 3048. Such a graded band gap may further improved non-volatile charge trap memory device performance. Reoxidation for this purpose after the deposition of the blocking layer 304C may enable a more controlled diffusion of oxidizer to controllably oxidize or reoxidize the thin charge trapping layer 304B.

Generally, the formation of the gate insulator layer 314 may include any conventional gate oxidation process whereby the substrate 302 is heated in the presence of an oxidizing gas such as, oxygen (O2), nitrous oxide (N2O), nitric oxide (NO), ozone (O3), and steam (H2O). In one embodiment, the gate oxidation process is performed at a higher temperature than the temperature at which the blocking layer 304C is deposited. In a particularly advantageous embodiment, a dilute wet oxidation is employed to form the gate insulator layer 314. The dilute wet oxidation is distinct from a conventional wet oxidation in that the H2:O2 ratio is between 1 and 1.3. In one specific embodiment, a dilute oxidation with an H2:O2 ratio of approximately 1.2 is performed at a temperature of between 800° C. and 900° C. In a further embodiment, the duration of the dilute oxidation is sufficient to grow between 5.0 nm and 15.0 nm of silicon dioxide where substrate 302 is silicon. In one such embodiment, the duration is sufficient to for an approximately 10 nm to 1.1 nm silicon dioxide layer to be formed on a silicon substrate. Such a dilute wet oxidation process advantageously reoxidizes a deposited blocking layer 304C and may further oxidize or reoxidize a portion of the charge trapping layer 304B.

Where a native oxide or a chemical oxide remains on the substrate 302 after the pre-clean module 212, a thermal oxidation forms a gate insulator layer 314 comprising silicon dioxide by consuming some of the silicon below the native or chemical oxide in the substrate 302. Therefore, where multiple MOS gate insulator layer thicknesses are to be employed, for example one thickness in the region for HV MOS transistor 350 and a second thickness in the region of MOS transistor 370, it may be advantageous to form the thickest gate insulator layer at module 214 of FIG. 2A prior to additional gate insulator layers of lesser thickness so that any native or chemical oxide formed since the formation of the ONO charge trapping dielectric stack 306 is completely consumed and the electrical impact of the native oxide on the resulting MOS device is reduced by the relatively greater gate insulator layer thickness.

In one embodiment depicted in FIG. 2A, if another gate insulator layer of differing composition and/or thickness is to be formed in the process, then the method 200 proceeds to module 218. At module 218 a photoresist layer 318 of FIG. 3D is deposited and patterned to have an opening 319 formed over a region of the substrate 302 that is to have the next insulator material and/or insulator layer thickness. At module 222, any previously formed gate insulator layers, such as gate insulator layer 314, depicted in FIG. 3D, are selectively removed to expose the substrate 302. Conventional lithography and etch techniques may be employed at modules 218 and 222, such as those described in reference to module 205.

Following the removal of the gate insulator layer(s), a pre-clean may be performed on the substrate 302. For example, in the module 224, while the photoresist layer 318 protects the ONO charge trapping dielectric stack 306 a clean which would be detrimental to the ONO charge trapping dielectric stack 306 if it were not protected by the photoresist layer 318 may be performed at this time. While in certain embodiments the clean in module 224 is not performed, in either case, the photoresist layer 318 is stripped at module 226, for example with conventional piranha clean and/or plasma ash operations, subsequent to the selective removal of the gate insulator layer(s).

With the ONO charge trapping dielectric stack 306 patterned and the gate insulator layer 314 patterned, the non-HF pre-clean module 212 may then be repeated in preparation of forming another gate insulator layer. Any of the processes described elsewhere herein for module 212, such as an ultra-dilute SC 1 clean, may be performed at this time to clean the substrate 302 in preparation for formation of an additional gate insulator layer in the opening 319. Following module 212, another gate insulator layer may be formed at module 214, such as gate insulator layer 320. Gate insulator layer 320 may be any of the materials described in reference to gate insulator layer 314 and not necessarily the same material as gate insulator layer 314. In one particular embodiment, gate insulator layer 320 is a thermally grown layer comprising silicon dioxide. In a further embodiment, the gate insulator layer 320 is formed over a third region of the substrate 302, such for MOS transistor 3 70, and is thinner than the gate insulator layer 314 formed over a second region of the substrate 302, such as for HV MOS transistor 350. In one such embodiment, the gate insulator layer 320 comprising silicon dioxide is formed to a thickness between approximately 3.0 nm and 8.0 nm while the gate insulator layer 314 is between 5 and 15 nm. Any of the processes described elsewhere herein for module 214 in reference to the formation of gate insulator layer 314 may also be employed to form the gate insulator layer 320. Additionally, the blocking layer 304C and charge trapping layer 304B may be reoxidized during the formation of the gate insulator layer 320, much as described in reference to the formation of the gate insulator layer 314. It should be appreciated such as reoxidation may be to a lesser extent than what occurs during the formation of the gate insulator layer 314, particularly where the gate insulator layer 320 is formed thinner than the gate insulator layer 314 or where the gate insulator layer 320 is formed with a process other than the dilute steam oxidation described for one embodiment of the gate insulator layer 314.

Figure 3C:
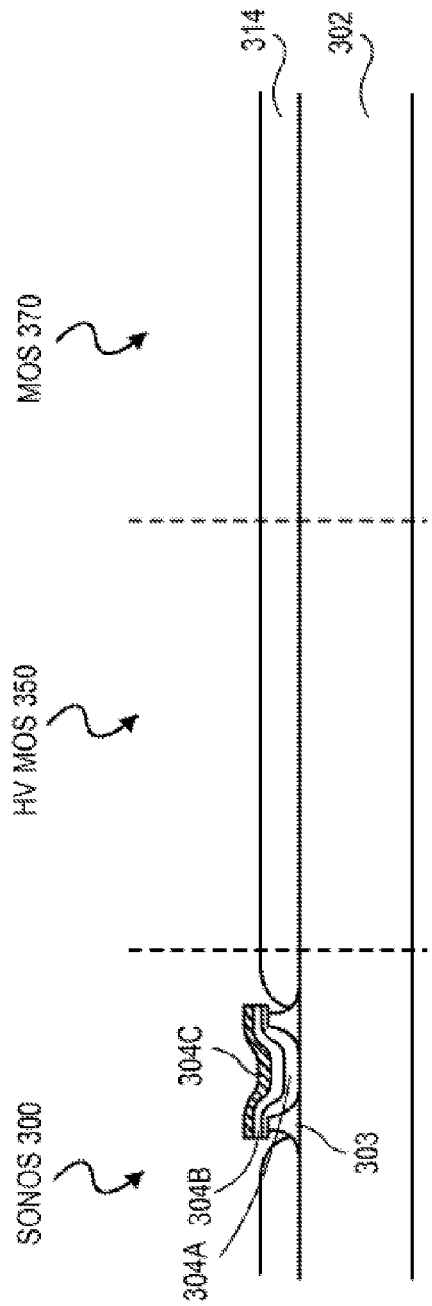
FIG. 3C illustrates a cross-sectional view representing operations in the formation of a semiconductor structure in which a first gate insulator layer is formed over the MOS and HV MOS regions, in accordance with an embodiment of the present invention.
Figure 3D:
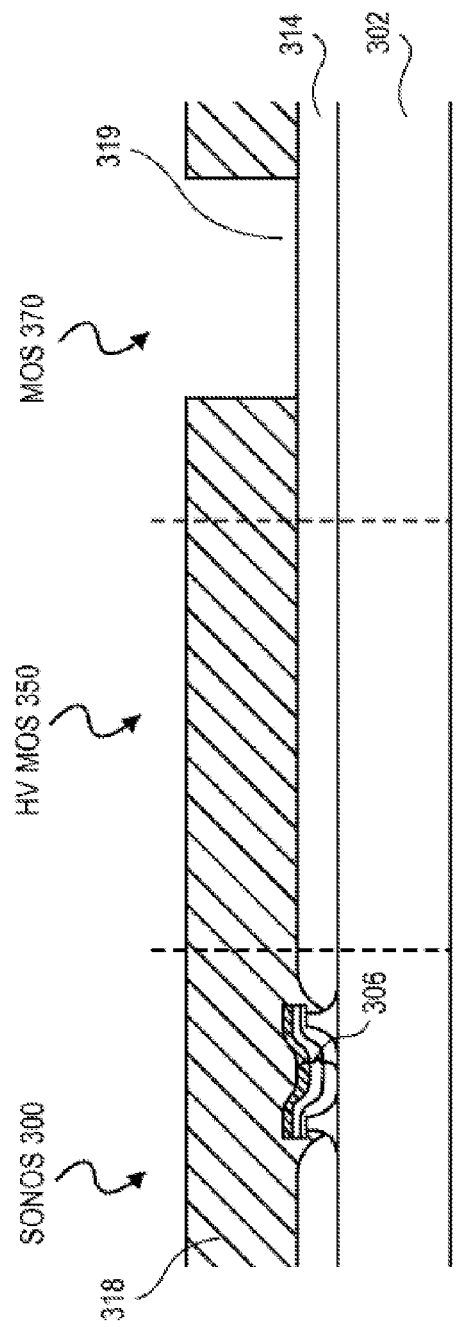
FIG. 3D illustrates a cross-sectional view representing operations wherein SONOS and HV MOS device regions are masked while the first gate insulator layer in the MOS region is opened in a third region of the substrate to form a second gate insulator layer, in accordance with an embodiment of the present invention.

If desired, modules 218, 222, 224, 226, 212 and 214 may be repeated any number of times to provide more than the two gate insulator layer thicknesses described in the embodiment depicted in FIGS. 3C-3E. In this manner, successively thinner gate insulator layers may be formed with each iteration. For example, a third gate insulator layer may be formed to between 2.0 nm and 3.5 nm, thinner than the gate insulator layer 314 and thinner than the gate insulator layer 320.

After forming at least one MOS gate insulator layer, such as the gate insulator layer 314, the embodiment depicted in FIG. 2A proceeds to module 228. At module 228, the gate insulator layer 314 and the ONO charge trapping dielectric stack 306 are nitrided or nitridized. Beyond nitriding the MOS gate insulator, this nitridation process serves to incorporate nitrogen into the ONO charge trapping dielectric stack 306 and improve the quality of the interfaces in the stack (e.g. between the dielectric layers 304C and 304B). This nitriding process, in certain embodiments, may incorporate approximately 4-10 wt % nitrogen into the blocking layer 304C. In a particular embodiment, the nitridation process includes heating substrate 302 in an atmosphere including nitrogen at a temperature approximately in the range of 900-1100° C.

In one embodiment, nitridation of the ONO charge trapping dielectric stack 306 is performed as part of forming the gate insulator layer (e.g. gate insulator layer 314 or gate insulator layer 320). Thus, modules 214 and 228 of FIG. 2A need not be performed in separate process equipment, but rather merely a separate step of a single process recipe. This nitriding process, in certain embodiments, may incorporate approximately 4-10 wt % nitrogen into the blocking layer 304C and approximately 4-10 wt % nitrogen into the gate insulator layer 314 and/or gate insulator layer 320. In one such embodiment, a CVD furnace is employed for the nitridation of module 228 and the duration of the nitridation may be for between 5 minutes and 10 minutes. In another embodiment, a single wafer tool may be employed for the nitridation of module 228, exposing the gate insulator layer(s) and ONO charge trapping dielectric stack 306 to a nitrogen-containing environment for a duration in the range of approximately 30 seconds to approximately 60 seconds.

In an embodiment, the atmosphere including nitrogen is composed of a gas such as, but not limited to nitrogen (N2), nitrous oxide (N20), nitrogen dioxide (N02), nitric oxide (NO) and ammonia (NH3). In still other embodiments, the nitrogen environment further includes deuterium through an introduction of gases in which hydrogen has been replaced by deuterium, including, for example, the substitution of ND3 for NH3. The substitution of deuterium for hydrogen may advantageously passivate Si dangling bonds at the substrate interface, thereby increasing non-volatile charge trap memory device parametrics, such as NBTI (Negative Bias Temperature Instability) lifetime.

In another particular embodiment, nitridation in module 228 is performed only once after the last gate insulator layer is formed, for example, after gate insulator layer 314 and gate insulator layer 320 have been formed. The single nitridation process therefore nitridizes the ONO charge trapping dielectric stack 306, the gate insulator layer 314 and the gate insulator layer 320, as depicted by the field lines of FIG. 3F. In such an embodiment, the single nitridation provides the benefits described herein while minimizing the thermal budget of the integrated process 200.

In another embodiment, the nitridation process of module 228 is performed only once after the first gate insulator is formed, for example, after gate insulator layer 314. In such an embodiment, the ONO charge trapping dielectric stack 306 is nitrided along with the gate insulator layer 314. Nitridation only after the first gate insulator may allow for some of the logic MOS devices fabricated on substrate 302, such as in the region for HV MOS transistor 350, to have a nitrided gate insulator layer while others do not, such as in the region for MOS transistor 370.

Embodiments employing nitridation immediately after the first gate insulator is formed may also improve the ability of the ONO charge trapping dielectric stack 306 to withstand exposure to a subsequent HF-based clean performed prior to forming a subsequent gate insulator layer, such as gate insulator layer 320. In one particular embodiment, a silicon dioxide gate insulator layer 314 is formed to a thickness of approximately 5.0 nm to 15.0 nm (consuming silicon below a native oxide on the substrate 302), the nitridation of module 228 is performed, a dilute HF-based clean is performed with the nitrided ONO charge trapping dielectric stack 306 exposed and then a silicon dioxide gate insulator layer 320 of a thickness between 2.0 and 8.0 nm is formed without consuming any significant thickness of native or chemical oxide on the substrate 302. In this particular embodiment, the nitridation operation of module 228, which may be part of a thick MOS gate insulator formation process, enables a dilute HF-based pre-clean chemistry to be employed for the more critical thin MOS gate insulator formation with minimal detrimental effect on the ONO charge trapping dielectric. In still other embodiments, each successive gate insulator formed includes the nitridation process of module 228 such that the ONO charge trapping dielectric stack 306 is exposed to a plurality of nitrogen anneals.

Following the nitridation of module 228 in FIG. 2A, the method 200 proceeds with module 230. At module 230, a gate layer 330 is deposited on both the ONO charge trapping dielectric stack 306 and on the gate insulator layers 314 and 320, as depicted in FIG. 30. The gate layer may be formed with any process conventionally known in the art. The gate layer may be any conductor or semiconductor material employed for gate layers in the art. In one embodiment, the gate layer 330 contains a metal, such as, but not limited to, hathium, zirconium, titanium, tantalum, aluminum, ruthenium, palladium, platinum, cobalt and nickel, their silicides, their nitrides and their carbides.

In another embodiment, the gate layer 330 is poly-silicon (p-silicon). In a further embodiment, the poly-silicon gate layer 330 may be dual-doped to have N+ conductivity over a first portion of the first and/or second gate insulator layer (314, 320) to form a HV NMOS and/or NMOS transistor, respectively, while having P+ conductivity over a second portion of the first and/or second gate insulator layer (314, 320) to form a HV PMOS and/or PMOS transistor, respectively. In a further embodiment, the poly-silicon gate layer 330 may be doped to have either N+ or P+ conductivity in the SONOS device 300. Thus, the dual-doped poly-silicon may form a P+ poly-silicon gate on an N-type SONOS memory device. Because the P+ polysilicon gate has a Fermi level approximately 1 eV higher that an N+ poly-silicon gate, the larger work function of a P+ poly-silicon gate on an N-type SONOS device channel may improve reliability by reducing the number of charge carriers entering the ONO charge trapping dielectric stack 306 relative to an N-type SONOS device having an N+ poly-silicon gate.

As further shown in FIG. 3H, a SONOS gate electrode is patterned over the substrate region of SONOS device 300, while a HV MOS gate electrode 358 and MOS gate electrode 378 are patterned over the HV MOS transistor 350 and MOS transistor 370 substrate regions, respectively. In a particular embodiment, the patterning of SO NOS gate electrode is performed with a dry etch stopping on the ONO charge trapping dielectric stack to protect the substrate semiconductor of the SONOS device 300.

Conventional tip and/or HALO implant process may then be performed at module 255 of FIG. 2A to form lightly doped drains (not pictured). Subsequently, at module 261 and as further depicted in FIG. 3 I, a sidewall spacer 309 is then formed adjacent to a sidewall of the SONOS gate electrode 308 and on the ONO charge trapping dielectric stack 306. Sidewall spacer 309, for example, may be comprised of silicon dioxide, silicon oxynitride, or silicon nitride and may also be patterned selectively to the ONO charge trapping dielectric stack 306. The ONO charge trapping dielectric stack 306 may then be subsequently etched to be self-aligned with sidewall spacer 309 to complete the formation of a SO NOS gate stack 301 as depicted in FIG. 3J. Similar processes may also form spacers 359 and 379 adjacent to HV MOS gate stack 351 and a MOS gate stack 371, respectively.

Figure 2B:
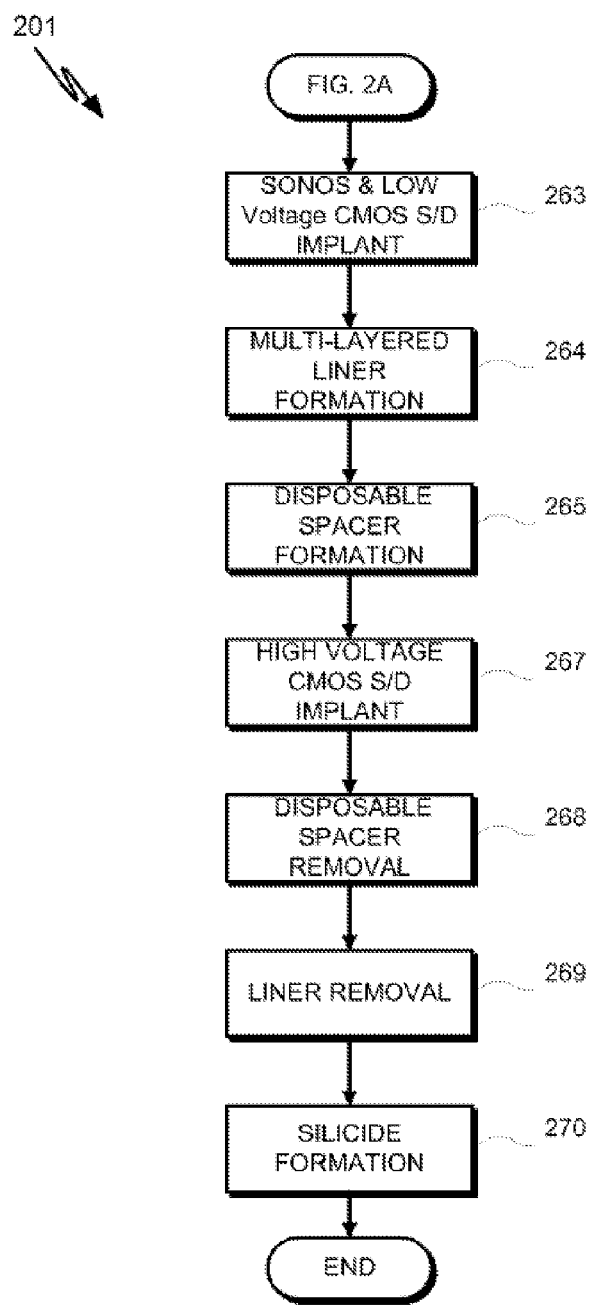

FIG. 4A illustrates a cross-sectional side view of devices following the source/drain implant module 263 of FIG. 2B. Illustration of gate stacks 301, 351 and 371 is simplified relative to those of FIG. 3J merely for clarity. SONOS device 300 now includes source and drain 410 in substrate 302 having a conductivity opposite to the channel region. For example, in accordance with an embodiment of the present invention, source and drain 410 are N-type doped while channel region of substrate 302 is P-type doped. In one embodiment, substrate 302 is comprised of boron-doped single-crystal silicon having a boron concentration in the range of $1 \times 10^{15} - 1 \times 10^{19}$ atoms/cm3 In another embodiment, source and drain 410 are comprised of phosphorous- or arsenic-doped regions having a concentration of N-type dopants in the range of 5×1016-1×1020 atoms/cm3 In a specific embodiment, source and drain 410 have a depth in substrate 302 in the range of 80-200 nanometers. In accordance with an alternative embodiment of the present invention, source and drain 410 are P-type doped while the channel region of substrate 302 is N-type doped. As further shown, lightly doped source and drain (LDD) 411, formed at module 255 of FIG. 2A, extend under sidewall spacer 309.

Both the HV MOS transistor 350 and MOS transistor 370 also include an LDD 461 and 481, respectively. MOS transistor 370 further includes a source and drain 480 adjacent to the sidewall spacer 3 79 and a distance T 1 away from below the sidewall of the gate stack 371. The source and drain 480 has an n-type conductivity and may, in certain embodiments, have substantially the same dopant concentration as that of the source and drain 410. However, as depicted in FIG. 4A, at module 263, the HV MOS transistor 350 lacks a source and drain analogous to the source and drain 410 and 480. Thus, during implantation of the source and drain 410 and 480, the HV MOS transistor 350 may be masked with a photosensitive mask or with a commonly known non-photosensitive hardmask, such as, but not limited to, amorphous carbon, that was previously patterned.

A multi-layered liner is then formed at module 264 of FIG. 2B. As depicted in FIG. 4B, a liner 485 is formed over the substrate 302, covering the SONOS device 300, the HV MOS transistor 350 and MOS transistor 370. In the particular embodiment depicted, the liner 485 is a multi-layered liner comprising a bottom liner layer 485A and a top liner layer 485B. The bottom liner layer 485A and top liner layer 485B may be any commonly employed materials. In a preferred embodiment, the top liner layer 485B may be anisotropically etched selectively to the bottom liner layer 485A. In one such embodiment, the bottom liner layer 485A is silicon dioxide while the top liner layer 485B is a silicon nitride. In an alternate embodiment, the bottom liner layer 485A is a silicon nitride while the top liner layer 485B is silicon dioxide. Other embodiments may include a top or bottom layer of silicon oxy-nitride, carbon-doped silicon nitride or boron-doped silicon nitride. While the multi-layered liner 485 has particular integration advantages discussed elsewhere herein, certain embodiments may also utilize a single layer liner comprised of, for example, a silicon dioxide layer or a silicon nitride layer.

A thin bottom liner layer 485A advantageously reduces the lateral thickness deposited on the sidewalls of the sidewall spacer 309, 359 and 379, which may be in close proximity to sidewalls of other devices. A thin bottom liner layer 485A may further reduce the amount of thickness variation in the film across different regions of the substrate 302, the advantage of which is discussed elsewhere herein. In one such embodiment, a silicon nitride bottom liner layer 485A is formed to a thickness of between about 2 nm about 15 nm, preferably between about 5 nm and about 8 nm. The thickness of the top liner layer 485B may be selected to provide the multi-layered liner with a desired thickness on the sidewall of the spacer 359, as discussed further elsewhere herein. In one embodiment, a silicon dioxide top liner layer 485B is formed to a thickness of between about 10 nm and 40 nm, preferably between about 20 nm and 30 nm.

The layers of the multi-layered liner 485 may be deposited with any commonly known techniques, such as, but not limited to, thermal oxidation, low pressure CVD (LPCVD) plasma enhanced CVD (PECVD) and ALD processes known to those of skill in the art. For example, a nitride bottom liner layer 485A may be deposited with a nitrogen precursor, such as NH3, and a silicon precursor, such as silane (SiH4), dichlorosilane (SiH2Ch), or bis(tertiary-butylamino)silane (BT-BAS). The deposition may be performed at a substrate temperature, for example between approximately 550° C. and approximately 850° C., and at a deposition chamber pressure between approximately 100 millitorr (mT) and approximately 700 mT, to form a film having a thickness anywhere within the ranges previously described.

An oxide layer top liner layer 485B may be similarly formed by thermal or chemical oxidation of the bottom liner layer 485A or a deposition process, such as an LPCVD employing any commonly known precursors, to form a film having a thickness anywhere within the ranges previously described. In a particular embodiment, either or both of the bottom liner layer 485A and top liner layer 485B may be deposited with techniques known to result in highly stressed films. Such stressed-film embodiments may make subsequent removal of either liner layer significantly faster and/or more selective to each other or underlying layers.

Figure 4C:
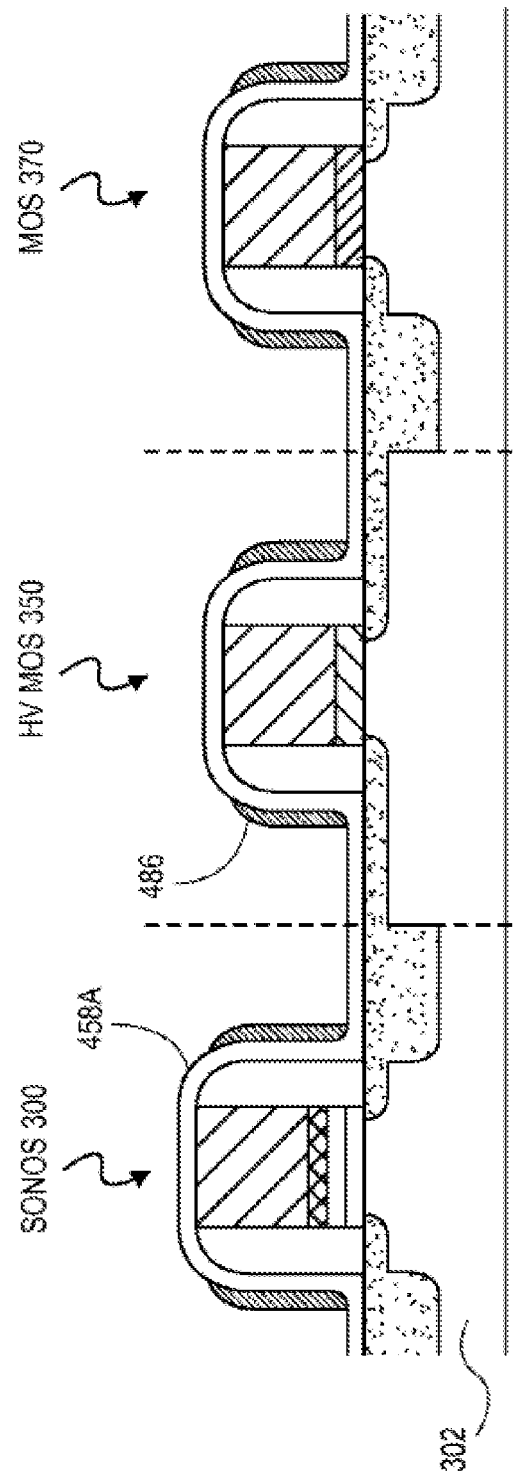
FIG. 4C illustrates a cross-sectional view representing operations in the formation of a semiconductor structure in which the top layer of the multi-layered liner is etched to form a disposable spacer, in accordance with an embodiment of the present invention.

At module 265 and as further depicted in FIG. 4C, the top liner layer 485B is anisotropically etched to form disposable sidewall spacer 486 along sidewalls of topography present under the multi-layered liner 485. The top liner layer 485B is etched selectively to the bottom liner layer 485A (i.e. the bottom liner layer 485A provides an etch stop). In one such embodiment, the bottom liner layer 485A remains a substantially continuous film over the substrate 302 after the top liner layer 485B is formed in to discrete disposable sidewall spacer 486.

The process selected to anisotropically etch the top liner layer 485B to form disposable sidewall spacer 486 is dependent on the materials chosen. In the particular embodiment employing a silicon nitride bottom layer 485A and a silicon dioxide top liner layer 485B a commonly known plasma etch process may be used, such as one with a fluorine chemistry like carbon tetrafluoride (CF4), having a high enough selectivity to silicon nitride to stop prior to etching through the bottom liner layer 485A. In an alternate embodiment employing a silicon dioxide bottom layer 485A and a silicon nitride top layer 485B, any commonly known plasma etch process may be used, such as one utilizing a fluorine-based chemistry, like nitrogen trifluoride (NF3), or one utilizing a chlorine-based chemistry.

Figure 4D:
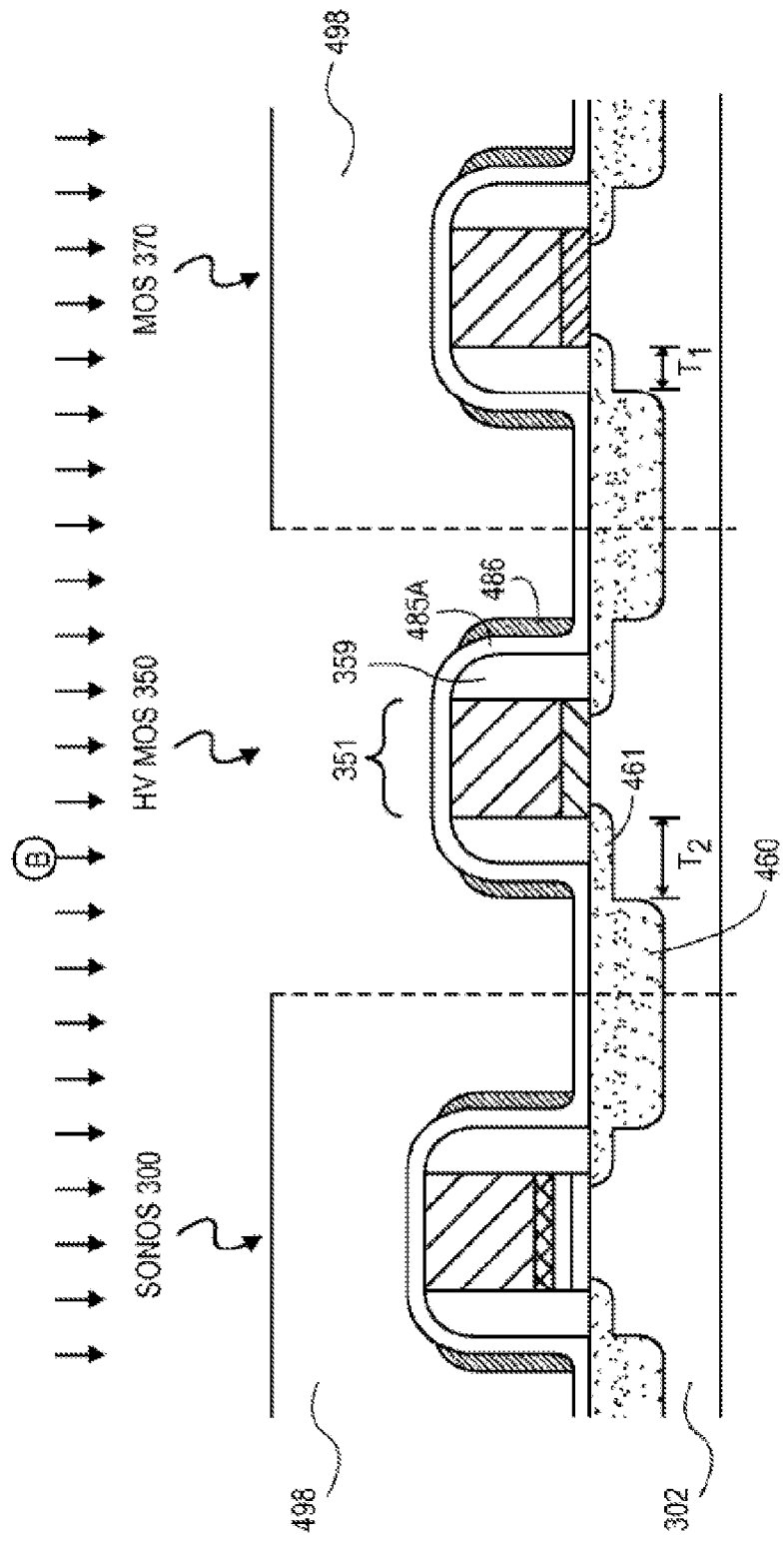
FIG. 4D illustrates a cross-sectional view representing operations in the formation of a semiconductor structure in which a HV MOS device receives a source and drain implant while the SONOS and MOS devices are masked, in accordance with an embodiment of the present invention.

Subsequent to the formation of the disposable sidewall spacer 486, a source and drain may be formed for the HV MOS transistor at module 267. In the embodiment further depicted in FIG. 4D, the source and drain 460 is formed with a p-type implant after a mask 498 is formed over the SONOS device 300 and MOS transistor 370. Mask 498 may be any commonly known photosensitive mask material (i.e. photoresist) or non-photosensitive mask, such as amorphous carbon, that was previously patterned. The p-type dopant may be any commonly employed in the art, such as a Boron species. Other embodiments include n-type dopants for HV NMOS transistors.

The implantation, is self-aligned to the gate stack 3 51 and offset from a sidewall of the gate stack 3 51 by a distance T 2. The distance T 2 is approximate} y equal to the sidewall thickness of the sidewall spacer 359 added to the sidewall thickness of the bottom liner layer 485A added to the sidewall thickness of the disposable sidewall spacer 486. In the embodiment shown in FIG. 40, the distance T2 for the HV MOS transistor 350 is greater than the distance T1 for the MOS transistor 3 70. In this manner, the source and drain 460 is offset by the distance T2, greater than T1, to increase the length of the LDD 461. Thus, the thickness of the top liner layer 485B deposited in the operation depicted in FIG. 4B may be predetermined to provide a disposable sidewall spacer 486 with the appropriate lateral width (thickness).

The relatively greater offset represented by T 2 may increase the breakdown voltage by reducing the encroachment of p-type dopant diffusion from the source and drain 460 into the channel region of the HV MOS transistor 350 during subsequent thermal processing. In the embodiment depicted, the p-type implant is made through the bottom liner layer 485A. As previously described, particular embodiments employ an advantageously thin bottom liner layer 485A to improve the uniformity of the implant profile across the substrate 302.

Following the formation of the source and drain 460, the mask 498 may be removed to expose the bottom liner layer 485A covering the SONOS device 300 and MOS transistor 370. At module 268 and as further shown in FIG. 4E, the disposable sidewall spacer 486 may then be removed. Removal of the disposable sidewall spacer 486 may advantageously increase the space between adjacent logic and non-volatile charge trap memory devices to enable a higher packing density of devices (i.e. smaller device pitch). This is particularly advantageous for SONOS device 300 which may be part of a closely spaced array of SONOS devices, such as in a memory cell array. Removal of the disposable sidewall spacer 486 may also improve the step coverage of subsequently deposited ILD layers over high density SONOS and logic devices.

Removal of the disposable sidewall spacer 486 may be with a masked process, whereby the disposable sidewall spacer 486 is removed, for example, from the SONOS device 300, but retained on the HV MOS transistor 350. However, in the embodiment depicted, the disposable sidewall spacer 486 is removed from the entire substrate 302 with an unmasked etch process. As shown, the etch process is selective to the bottom liner layer 485A (i.e. the bottom liner layer 485A acts as an etch stop for the etch process employed to remove the disposable sidewall spacer 486. With the protection of bottom liner layer 485A, substrate semiconductor and substrate insulator layers, such as shallow trench isolation (STI) are protected from the process employed to remove the disposable sidewall spacer 486. Because it has been found that processing of the corner (not pictured, but is out of the plane of FIG. 4E) formed where the STI meets the width of the gate stack 301 can greatly effect the performance of the SONOS device 300, it is advantageous not to expose this region to the process employed for disposable spacer removal.

With the bottom liner 485A serving as an etch stop layer, the substrate 302, the SONOS gate electrode 308, the HV PMOS gate layer 358 and the NMOS gate layer 378, as well as the sidewall spacers 309, 359 and 379 remain protected during the removal of the disposable sidewall spacer 486. With such features protected, the material composition of the disposable sidewall spacer 486 (i.e. top liner layer 485B) is independent of the materials in the gate electrodes 308, 358 and 378 and the sidewall spacers 309, 359 and 379.

Disposable sidewall spacer 486 may be removed with commonly known wet chemical or dry etch processes, depending on the materials employed in the particular implementation. In one embodiment, wherein the disposable sidewall spacer 486 comprises silicon dioxide (i.e. a silicon dioxide top liner layer 485B), a hydrofluoric acid (HF) based wet chemical etch may be performed to remove the disposable sidewall spacer 486 selectively to a silicon nitride bottom liner layer 485A. In an alternate implementation, an isotropic dry etch process, such as one commonly known to have a high selectivity over the silicon nitride bottom liner layer 485A may be employed. In another embodiment, wherein the disposable sidewall spacer 486 comprises silicon nitride (i.e. a silicon nitride top liner layer 485B), a hot phosphoric acid (H3P04) based wet chemical etch may be performed to remove the disposable sidewall spacer 486 selectively to a silicon dioxide bottom liner layer 485A. In an alternate implementation, an isotropic dry etch process, such as one commonly known to have a high selectivity over the silicon dioxide bottom liner layer 485A may be employed.

Subsequent to the removal of the disposable sidewall spacer 486, the bottom liner layer 485A may be removed at module 269 to expose the source and drain regions of either or both of the SONOS and logic devices in preparation for a silicidation or salicidation (self-aligned silicidation) process at module 270. In one embodiment, a blanket strip of the bottom liner layer 485A may be performed to expose the source and drain regions of all devices. In such an embodiment, the strip process is preferably selective to the STI corner, the gate electrodes 308, 358 and 378 and the sidewall spacers 309, 359 and 379. FIG. 4F, however, depicts an alternate embodiment utilizing a patterned etch of the bottom liner layer 485A. The patterned etch exposes only the source and drains of those devices for which silicide is desired. The bottom liner layer 485A may thereby further provide for device-dependent silicidation.

As previously discussed, because the silicidation process can induce stress, silicide may be detrimental to the performance and reliability of the SONOS device 300. Therefore, a device-dependent silicidation process may be advantageous for integrating a logic device, such as MOS transistor 3 70, having silicide contacts with a non-volatile charge trap memory device, such as SONOS device 300, having silicide-free contacts. Similarly, a HV MOS device, such as HV MOS transistor 350, may include either silicide or silicide-free contacts. As shown in FIG. 4E, the LDD region 461 extends beyond the sidewall spacer 359 and bottom liner 485A (i.e. below where the disposable sidewall spacer 486 was removed) and formation of silicide over this exposed LDD region may not be desirable.

In one embodiment, as shown in FIG. 4F, a mask 499 is formed over the SONOS device 300 and HV MOS transistor 350. Mask 499 may be any commonly known photosensitive mask material (i.e. photoresist) or non-photosensitive mask, such as amorphous carbon, which is first patterned. The bottom liner layer 485A may then be etched to expose the regions of the MOS transistor 370 for subsequent silicidation. Removal of the bottom liner layer 485A may be done by any commonly known means dependent on the material composition. Advantageously, the removal process should be selective to the semiconductor substrate 302 and the STI (not shown). It may further be advantageously selective to the gate layer 378, and the sidewall spacer 379. In one particular embodiment employing a silicon nitride bottom liner layer 485A, a phosphoric acid-based wet chemical etch is utilized. In an alternate embodiment employing a silicon dioxide bottom liner layer 485A, an HF-based wet chemical etch may be used. Because the thickness of bottom liner layer 485A is relatively small, the etch and over etch time may be kept short to avoid eroding under layers. Furthermore, a wet chemical etch rate may be greatly enhanced for those embodiments previously described having a highly stressed bottom liner layer 485A. In still other embodiments, a dry plasma etch employing commonly known process parameters may also be used to remove the unmasked portion of the bottom liner layer 485A. Mask 499 may then be removed.

As shown in FIG. 4O, a silicide process may then be performed on those areas with exposed silicon. The silicide process may be any commonly employed in the art, typically including a pre-clean etch, cobalt or nickel metal deposition, anneal and wet strip. As depicted, silicide region 482 may be formed on the exposed gate layer 3 78 and exposed source and drain region while blocked by the bottom liner layer 485A from the SONOS device 300 and HV device (e.g. MOS transistor 350) regions.

In one embodiment, subsequent to the operations depicted in FIG. 40, processing proceeds, as shown in FIG. 5, with a removal of the bottom liner layer 485A and deposition of ILD 504. Such an embodiment has the advantage of simplifying a subsequent contact etch because etching of ILD 504 will expose the source and drain 410, the source and drain 460 and the silicide region 482 of the MOS transistor 370. In this embodiment, the devices with silicide may be masked with any commonly known photosensitive mask material (i.e. photoresist) or nonphotosensitive mask, such as amorphous carbon, which is first patterned. Masking of the silicided devices (e.g. MOS transistor 370) is advantageous if the process employed to remove the bottom liner layer 485A is nonselective to the silicide. Otherwise, a blanket strip of the bottom liner layer 485A may be performed. A backend interconnect process may then begin with a deposition of ILD 504 over nonsilicided SONOS device 300, non-silicided HV MOS transistor 350 and silicided MOS transistor 370.

In an alternative embodiment shown in FIG. 6A, subsequent to the operations depicted in FIG. 40, processing proceeds with deposition of an ILD over the bottom liner layer 485A and over the silicide region 482. In such an embodiment, the bottom liner layer 485A is incorporated as part of the backend ILD and subsequently removed during contact etch with an etch step selective over the silicide region 482. In a particular embodiment employing a silicon nitride bottom liner layer 485A, the bottom liner layer 485A may be further utilized in a self-aligned contact (SAC) etch. The SAC etch, employing an etch recipe highly selective to silicon nitride may reduce the contact dimension from that lithographically printed to the physical space between adjacent devices covered with the bottom liner layer 485A.

As further depicted in FIG. 6A, the ILD layer deposited over the bottom liner layer 485A and silicide region 482 may include a stress-inducing layer 504A. Stress-inducing layer 504A may be composed of any material and have any thickness suitable to exert a stress on channel region of a logic device. Stress inducing layer 504A may advantageously increase the carrier mobility and drive currents of a logic device, such as MOS transistor 370. In accordance with an embodiment of the present invention, stress-inducing layer 504A is disposed directly on MOS transistor 3 70. In one embodiment, stress-inducing layer 504A is deposited to a thickness approximately in the range of 20-100 nanometers and is composed of a material such as, but not limited to, silicon nitride, silicon oxy-nitride, carbon-doped silicon nitride or boron-doped silicon nitride. In a specific embodiment, stress inducing layer 504A is a tensile stress-inducing layer.

Because the stress inducing layer 504A may induce an undesirable stress in the SONOS device 300, causing performance and reliability degradation, the bottom liner layer 485A may have been deposited under conditions to induce a stress opposing that of stress inducing layer 504A. In a particular embodiment, the bottom liner layer 485A may induce a compressive stress opposing a tensile stress in the stress inducing layer 504A. In one such embodiment, the stress of the bottom liner layer 485A reduces the cumulative stress on the SONOS device 300 to an amount less than half that induced by the stress inducing layer 504A in absence of the bottom liner layer 485A. The bottom liner layer 485A may therefore provide both selective silicidation and selective stress induction for integration of the SONOS device 300 and a logic device, such as MOS transistor 370. As further shown in FIG. 4, ILD layer 504B may then be deposited over stress inducing layer 504A and planarized as part of a conventional backend interconnect process.

In still another embodiment, as depicted in FIG. 6B, the bottom liner layer 485A may provide an etch stop for removal of the stress-inducing layer 504A from over the SONOS device 300 and HV MOS transistor 350. The portion of stress inducing layer 504A above a nonvolatile charge trap memory device (e.g. SONOS device 300) may be removed through a lithography and etch process selective to the bottom liner layer 485A. In one embodiment, the portion of stress-inducing layer 504A above MOS transistor 370 is first masked—with a patterned photo-resist layer and the portion of stress-inducing layer 504A above SONOS device 300 is then removed by a technique such as, but not limited to, a wet etch process using hot phosphoric acid or a conventional dry etch process.

In embodiments where the bottom liner layer 485A is a silicon dioxide, the stress inducing layer 504A may be removed with high selectively to the bottom liner layer 485A. In other embodiments employing a silicon nitride bottom liner layer 485A, the higher stress of the stress inducing layer 504A may provide selectivity to the bottom liner layer 485A. The bottom liner layer 485A therefore may provide protection to the underlying structures during patterning of the stress inducing layer 504A. In alternate embodiments, removal of the stress inducing layer 504A also removes the bottom liner layer 485A.

As shown in FIG. 6B, if the stress inducing layer 504A is removed selectively to the bottom liner layer 485A (e.g. to prevent a stress inducing layer 504A from detrimentally impacting performance of SONOS device 300 or HV MOS transistor 350), the ILD layer 504B may then be deposited over both the bottom liner layer 485A and over the stress inducing layer 504A in preparation for further backend interconnect processing.

Implementations and Alternatives

In another aspect the present disclosure is directed to multigate or multigate-surface memory devices including charge-trapping regions overlying two or more sides of a channel formed on or above a surface of a substrate, and methods of fabricating the same. Multigate devices include both planar and non-planar devices. A planar multigate device (not shown) generally includes a double-gate planar device in which a number of first layers are deposited to form a first gate below a subsequently formed channel, and a number of second layers are deposited thereover to form a second gate. A non-planar multigate device generally includes a horizontal or vertical channel formed on or above a surface of a substrate and surrounded on three or more sides by a gate.

Figure 7A:
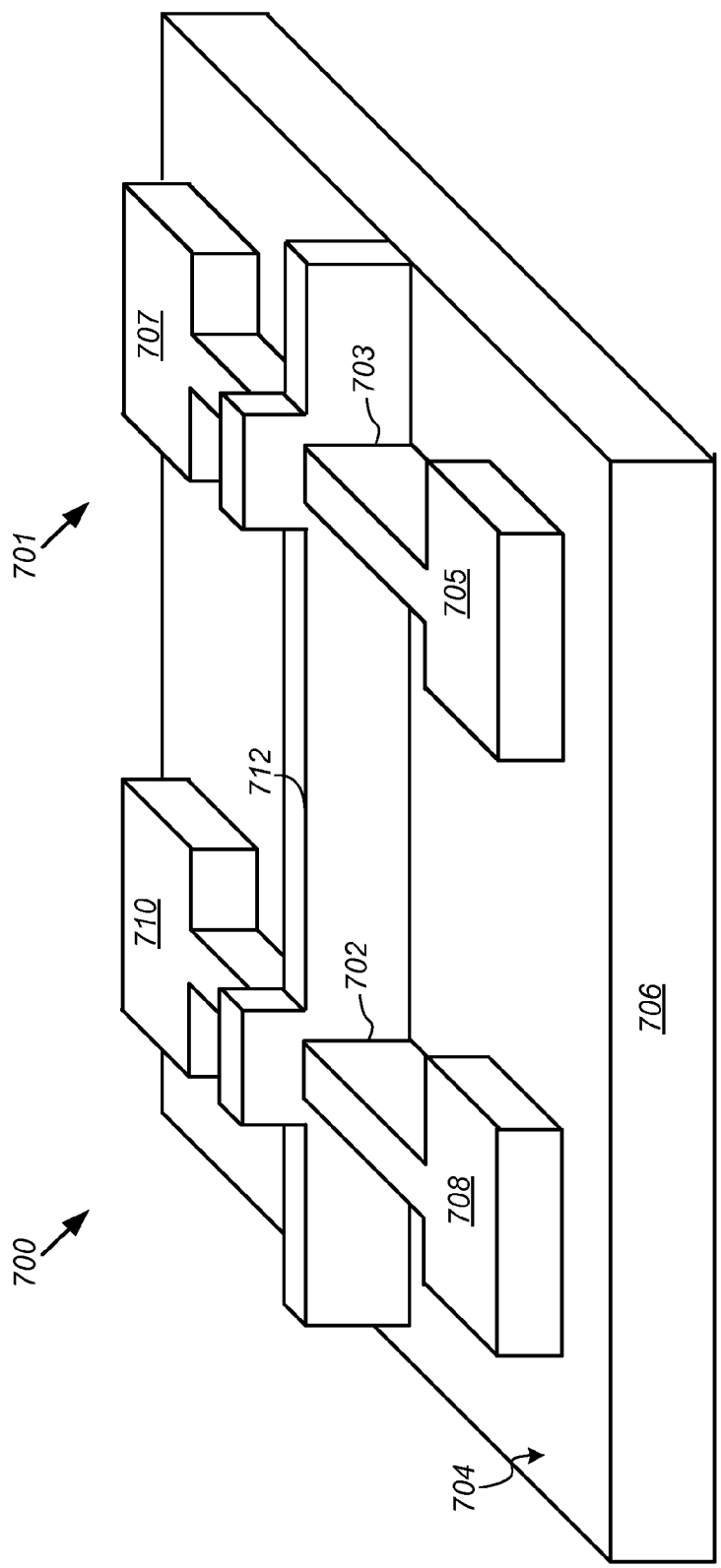
FIG. 7A illustrates a non-planar multigate device including a split charge-trapping region.

FIG. 7A illustrates one embodiment of a non-planar multigate memory device 700 including a charge-trapping region formed above a first region of a substrate, and a MOS device 701 integrally formed adjacent thereto in a second region. Referring to FIG. 7A, the memory device 700, commonly referred to as a finFET, includes a channel 702 formed from a thin film or layer of semiconducting material overlying a surface 704 on a substrate 706 connecting a source 708 and a drain 710 of the memory device. The channel 702 is enclosed on three sides by a fin which forms a gate 712 of the device. The thickness of the gate 712 (measured in the direction from source to drain) determines the effective channel length of the device.

Figure 7B:
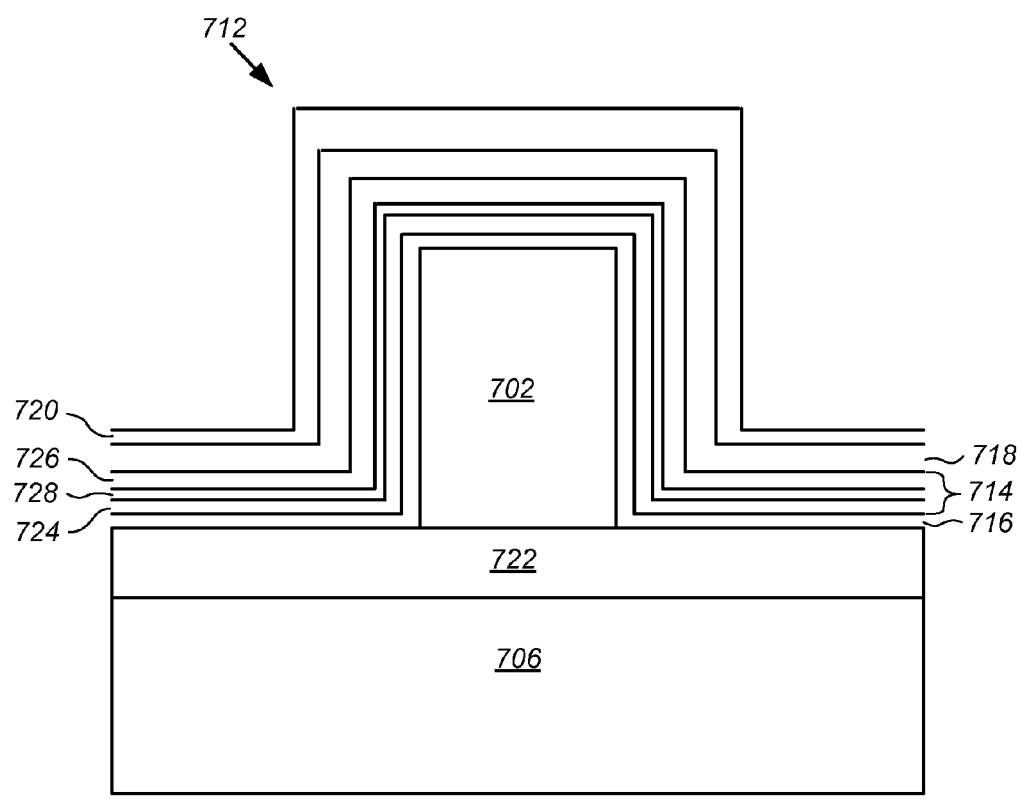
FIG. 7B illustrates a cross-sectional view of the non-planar multigate device of FIG. 7A.

In accordance with the present disclosure, the non-planar multigate memory device 700 of FIG. 7A can include a split charge-trapping region. FIG. 7B is a cross-sectional view of a portion of the non-planar memory device of FIG. 7A including a portion of the substrate 706, channel 702 and the gate 712 illustrating a split charge-trapping region 714. The gate 712 further includes a tunnel oxide 716 overlying a raised channel 702, a blocking dielectric 718 and a metal gate layer 720 overlying the blocking layer to form a control gate of the memory device 700. In some embodiments a doped polysilicon may be deposited instead of metal to provide a polysilicon gate layer. The channel 702 and gate 712 can be formed directly on substrate 706 or on an insulating or dielectric layer 722, such as a buried oxide layer, formed on or over the substrate.

Referring to FIG. 7B, the split charge-trapping region 714 includes at least one lower or bottom charge-trapping layer 724 comprising nitride closer to the tunnel oxide 716, and an upper or top charge-trapping layer 726 overlying the bottom charge-trapping layer. Generally, the top charge-trapping layer 726 comprises a silicon-rich, oxygen-lean nitride layer and comprises a majority of a charge traps distributed in multiple charge-trapping layers, while the bottom charge-trapping layer 724 comprises an oxygen-rich nitride or silicon oxynitride, and is oxygen-rich relative to the top charge-trapping layer to reduce the number of charge traps therein. By oxygen-rich it is meant wherein a concentration of oxygen in the bottom charge-trapping layer 724 is from about 11 to about 40%, whereas a concentration of oxygen in top charge-trapping layer 726 is less than about 5%.

In one embodiment, the blocking dielectric 718 also comprises an oxide, such as an HTO, to provide an ONNO structure. The channel 702 and the overlying ONNO structure can be formed directly on a silicon substrate 706 and overlaid with a doped polysilicon gate layer 720 to provide a SON-NOS structure.

In some embodiments, such as that shown in FIG. 7B, the split charge-trapping region 714 further includes at least one thin, intermediate or anti-tunneling layer 728 comprising a dielectric, such as an oxide, separating the top charge-trapping layer 726 from the bottom charge-trapping layer 724. The anti-tunneling layer 728 substantially reduces the probability of electron charge that accumulates at the boundaries of the upper nitride layer 726 during programming from tunneling into the bottom nitride layer 724, resulting in lower leakage current than for the conventional structures.

As with the embodiments described above, either or both of the bottom charge-trapping layer 724 and the top charge-trapping layer 726 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The top charge-trapping layer 726 has a stoichiometric composition of oxygen, nitrogen and/or silicon different from that of the bottom charge-trapping layer 724, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 728 comprising oxide, the anti-tunneling layer can be formed by oxidation of the bottom oxynitride layer, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

Finally, in those embodiments including a blocking dielectric 718 comprising oxide the oxide may be formed or deposited by any suitable means. In one embodiment the oxide of the blocking dielectric 718 is a high temperature oxide deposited in a HTO CVD process. Alternatively, the blocking dielectric 718 or blocking oxide layer may be thermally grown, however it will be appreciated that in this embodiment the top nitride thickness may be adjusted or increased as some of the top nitride will be effectively consumed or oxidized during the process of thermally growing the blocking oxide layer. A third option is to oxidize the top nitride layer to a chosen depth using radical oxidation.

A suitable thickness for the bottom charge-trapping layer 724 may be from about 30 Å to about 80 Å (with some variance permitted, for example ±10 Å), of which about 5-20 Å may be consumed by radical oxidation to form the anti-tunneling layer 728. A suitable thickness for the top charge-trapping layer 726 may be at least 30 Å. In certain embodiments, the top charge-trapping layer 726 may be formed up to 90 Å thick, of which 30-70 Å may be consumed by radical oxidation to form the blocking dielectric 718. A ratio of thicknesses between the bottom charge-trapping layer 724 and top charge-trapping layer 726 is approximately 1:1 in some embodiments, although other ratios are also possible.

In other embodiments, either or both of the top charge-trapping layer 726 and the blocking dielectric 718 may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

In the embodiment shown in FIG. 7A, the MOS device 701 is also a finFET, and includes a channel 703 formed from a thin film or layer of semiconducting material overlying the surface 704 on the substrate 706 connecting a source 705 and a drain 707 of the MOS device. The channel 703 is also enclosed on three sides by the fin which forms a gate of the device. However, the MOS device 701 can also include a planar device, as shown in FIG. 7C, formed in or on the surface of the substrate by any of methods or embodiments described above with respect to FIGS. 1A-10. For example, in one embodiment the MOS device 701 is a FET including a gate 730 and gate dielectric layer 732 overlying a doped channel region 734 in a deep well 736 formed in a second region 738 of the substrate, and separated from the memory device 700 in the first region 740 by an isolation region 742, such as a shallow trench isolation region. In certain embodiments, forming the MOS device 701 comprises performing a thermal oxidation to simultaneously form the gate dielectric layer 732 of the MOS device while thermally reoxidizing the blocking layer 718. In one particular embodiment, the method can further comprise performing a nitridation process as described above to simultaneously nitridize the gate dielectric layer 732 and the blocking layer 718.

Figure 8:
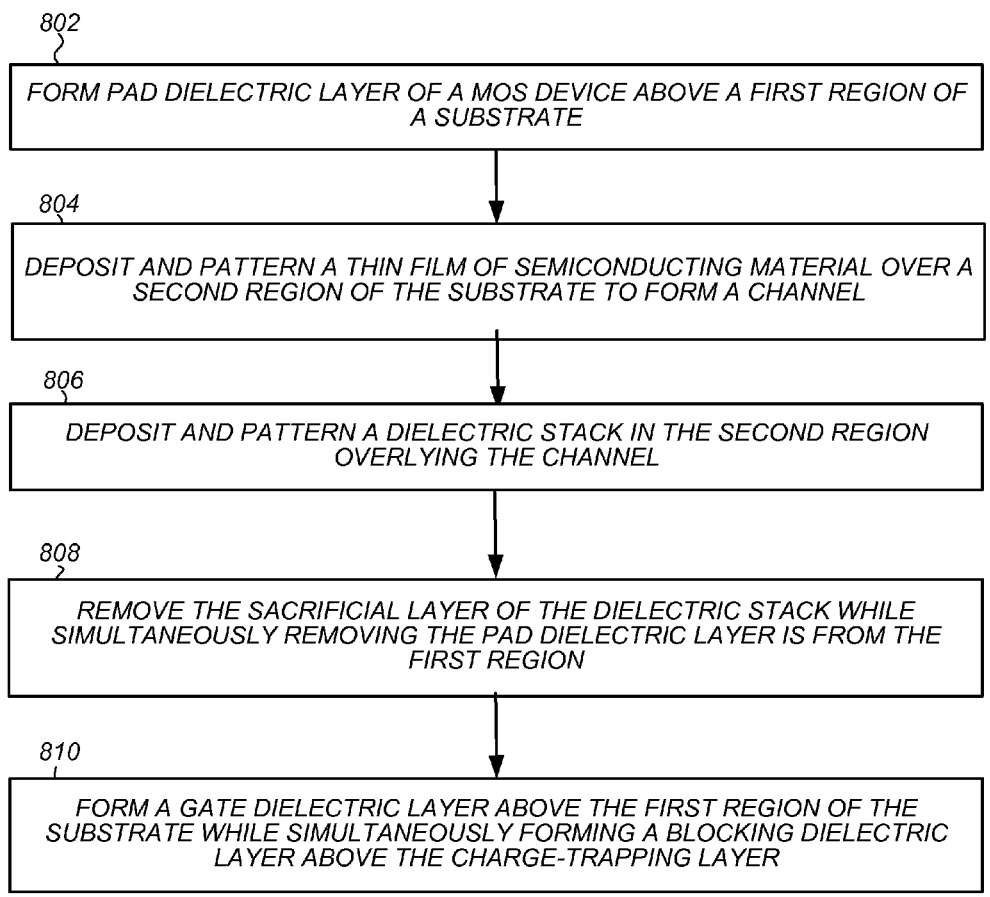
FIG. 8 illustrates a flow diagram depicting sequences of particular modules employed in the fabricating a non-planar multigate device integrated with a logic MOS device.

FIG. 8 illustrates a flow diagram depicting sequences of particular modules employed in the fabrication process of a non-volatile charge trap memory device integrated with a logic MOS device, in accordance with particular embodiments of the present invention. Referring to FIG. 8, the method begins with formation of a pad dielectric layer of a MOS device above a first or MOS region of a substrate (module 802). A pad dielectric layer may be deposited or grown above by any conventional technique, such as, but not limited to thermally grown with a dry oxidation technique at a temperature of 800° C.-900° C. to a thickness of approximately 100 Å. To include a non-planar, multigate nonvolatile memory device on the same substrate as the MOS device, a thin film of semiconducting material is formed over a surface of the substrate in a second, memory device region, and patterned to form a channel connecting a source and a drain of the memory device (module 804). The thin film of semiconducting material may be composed of a single crystal of a material which may include, but is not limited to, silicon, germanium, silicon-germanium or a III-V compound semiconductor material deposited by any conventional technique, such as, but not limited to epitaxial deposition in a LPCVD chamber.

A patterned dielectric stack of the non-volatile memory device is formed over the second, memory device region, and patterned to remove that portion of the dielectric stack not overlying the channel (module 806). The dielectric stack generally includes a tunnel layer, a charge-trapping layer, and a sacrificial top layer overlying the charge-trapping layer. The individual layers of the dielectric stack can include silicon oxides, silicon nitrides and silicon nitrides having various stoichiometric compositions of oxygen, nitrogen and/or silicon, and may deposited or grown by any conventional technique, such as, but not limited to thermally grown oxides, radical oxidation and CVD processes, as described above.

Next, in some embodiments the sacrificial layer is removed from the top of the dielectric stack while the pad dielectric layer is simultaneously removed from the first region of the substrate (module 808), and a gate dielectric layer formed above the first region of the substrate while a blocking dielectric layer is simultaneously formed above the charge-trapping layer (module 810). Generally, the sacrificial layer and pad layer are removed by exposing the substrate to a standard gate pre-clean chemistry such as a dilute HF solution or BOE solution to remove. The gate dielectric layer and the blocking dielectric layer may be formed utilizing a technique capable of oxidizing both the substrate and charge-trapping layer. In one embodiment the gate dielectric layer and blocking dielectric layer are formed utilizing a radical oxidation technique, such as ISSG or plasma based oxidation, which consume a portion of the substrate and charge-trapping layer, respectively.

In another embodiment, shown in FIGS. 9A and 9B, the memory device can include a nanowire channel formed from a thin film of semiconducting material overlying a surface on a substrate connecting a source and a drain of the memory device. By nanowire channel it is meant a conducting channel formed in a thin strip of crystalline silicon material, having a maximum cross-sectional dimension of about 10 nanometers (nm) or less, and more preferably less than about 6 nm. Optionally, the channel can be formed to have <100> surface crystalline orientation relative to a long axis of the channel.

Referring to FIG. 9A, the memory device 900 includes a horizontal nanowire channel 902 formed from a thin film or layer of semiconducting material on or overlying a surface on a substrate 906, and connecting a source 908 and a drain 910 of the memory device. In the embodiment shown, the device has a gate-all-around (GAA) structure in which the nanowire channel 902 is enclosed on all sides by a gate 912 of the device. The thickness of the gate 912 (measured in the direction from source to drain) determines the effective channel length of the device.

In accordance with the present disclosure, the non-planar multigate memory device 900 of FIG. 9A can include a split charge-trapping region. FIG. 9B is a cross-sectional view of a portion of the non-planar memory device of FIG. 9A including a portion of the substrate 906, nanowire channel 902 and the gate 912 illustrating a split charge-trapping region. Referring to FIG. 9B, the gate 912 includes a tunnel oxide 914 overlying the nanowire channel 902, a split charge-trapping region, a blocking dielectric 916 and a gate layer 918 overlying the blocking layer to form a control gate of the memory device 900. The gate layer 918 can comprise a metal or a doped polysilicon. The split charge-trapping region includes at least one inner charge-trapping layer 920 comprising nitride closer to the tunnel oxide 914, and an outer charge-trapping layer 922 overlying the inner charge-trapping layer. Generally, the outer charge-trapping layer 922 comprises a silicon-rich, oxygen-lean nitride layer and comprises a majority of a charge traps distributed in multiple charge-trapping layers, while the inner charge-trapping layer 920 comprises an oxygen-rich nitride or silicon oxynitride, and is oxygen-rich relative to the outer charge-trapping layer to reduce the number of charge traps therein.

In some embodiments, such as that shown, the split charge-trapping region further includes at least one thin, intermediate or anti-tunneling layer 924 comprising a dielectric, such as an oxide, separating outer charge-trapping layer 922 from the inner charge-trapping layer 920. The anti-tunneling layer 924 substantially reduces the probability of electron charge that accumulates at the boundaries of outer charge-trapping layer 922 during programming from tunneling into the inner charge-trapping layer 920, resulting in lower leakage current.

As with the embodiment described above, either or both of the inner charge-trapping layer 920 and the outer charge-trapping layer 922 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer. The second nitride layer of the multi-layer charge storing structure is then formed on the middle oxide layer. The outer charge-trapping layer 922 has a stoichiometric composition of oxygen, nitrogen and/or silicon different from that of the inner charge-trapping layer 920, and may also be formed or deposited by a CVD process using a process gas including $DCS/NH_3$ and $N_2O/NH_3$ gas mixtures in ratios and at flow rates tailored to provide a silicon-rich, oxygen-lean top nitride layer.

In those embodiments including an intermediate or anti-tunneling layer 924 comprising oxide, the anti-tunneling layer can be formed by oxidation of the inner charge-trapping layer 920, to a chosen depth using radical oxidation. Radical oxidation may be performed, for example, at a temperature of 1000-1100° C. using a single wafer tool, or 800-900° C. using a batch reactor tool. A mixture of $H_2$ and $O_2$ gasses may be employed at a pressure of 300-500 Tor for a batch process, or 10-15 Tor using a single vapor tool, for a time of 1-2 minutes using a single wafer tool, or 30 min-1 hour using a batch process.

Finally, in those embodiments in which the blocking dielectric 916 comprises oxide, the oxide may be formed or deposited by any suitable means. In one embodiment the oxide of blocking dielectric 916 is a high temperature oxide deposited in a HTO CVD process. Alternatively, the blocking dielectric 916 or blocking oxide layer may be thermally grown, however it will be appreciated that in this embodiment the thickness of the outer charge-trapping layer 922 may need to be adjusted or increased as some of the top nitride will be effectively consumed or oxidized during the process of thermally growing the blocking oxide layer.

A suitable thickness for the inner charge-trapping layer 920 may be from about 30 Å to about 80 Å (with some variance permitted, for example ±10 Å), of which about 5-20

Å may be consumed by radical oxidation to form the anti-tunneling layer 924. A suitable thickness for the outer charge-trapping layer 922 may be at least 30 Å. In certain embodiments, the outer charge-trapping layer 922 may be formed up to 90 Å thick, of which 30-70 Å may be consumed by radical oxidation to form the blocking dielectric 916. A ratio of thicknesses between the inner charge-trapping layer 920 and the outer charge-trapping layer 922 is approximately 1:1 in some embodiments, although other ratios are also possible.

In other embodiments, either or both of the outer charge-trapping layer 922 and the blocking dielectric 916 may comprise a high K dielectric. Suitable high K dielectrics include hafnium based materials such as HfSiON, HfSiO or HfO, Zirconium based material such as ZrSiON, ZrSiO or ZrO, and Yttrium based material such as $Y_2O_3$.

FIG. 9C illustrates a cross-sectional view of a vertical string of non-planar multigate devices 900 of FIG. 9A arranged in a Bit-Cost Scalable or BiCS architecture 926. The architecture 926 consists of a vertical string or stack of non-planar multigate devices 900, where each device or cell includes a channel 902 overlying the substrate 906, and connecting a source and a drain (not shown in this figure) of the memory device, and having a gate-all-around (GAA) structure in which the nanowire channel 902 is enclosed on all sides by a gate 912. The BiCS architecture reduces number of critical lithography steps compared to a simple stacking of layers, leading to a reduced cost per memory bit.

In another embodiment, the memory device is or includes a non-planar device comprising a vertical nanowire channel formed in or from a semiconducting material projecting above or from a number of conducting, semiconducting layers on a substrate. In one version of this embodiment, shown in cut-away in FIG. 10A, the memory device 1000 comprises a vertical nanowire channel 1002 formed in a cylinder of semiconducting material connecting a source 1004 and drain 1006 of the device. The channel 1002 is surrounded by a tunnel oxide 1008, a charge-trapping region 1010, a blocking layer 1012 and a gate layer 1014 overlying the blocking layer to form a control gate of the memory device 1000. The channel 1002 can include an annular region in an outer layer of a substantially solid cylinder of semiconducting material, or can include an annular layer formed over a cylinder of dielectric filler material. As with the horizontal nanowires described above, the channel 1002 can comprise polysilicon or recrystallized polysilicon to form a monocrystalline channel. Optionally, where the channel 1002 includes a crystalline silicon, the channel can be formed to have <100> surface crystalline orientation relative to a long axis of the channel.

Figure 10A:
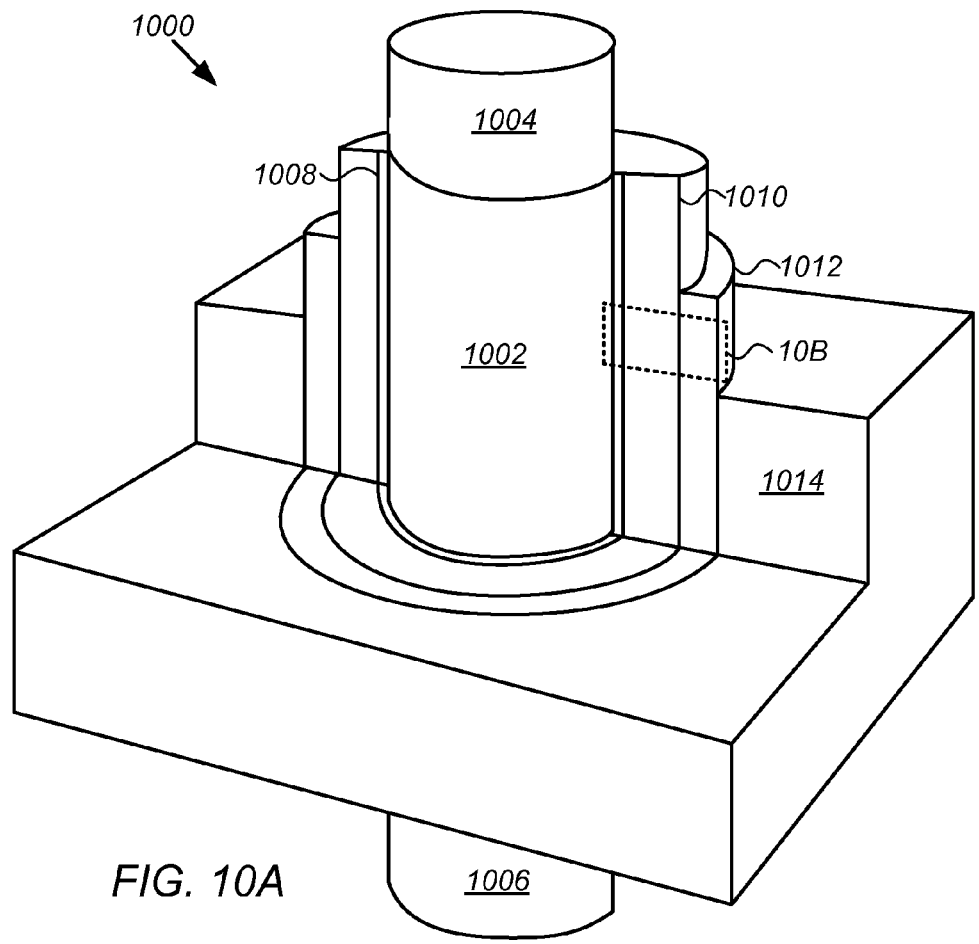
FIGS. 10A and 10B illustrate a non-planar multigate device including a split charge-trapping region and a vertical nanowire channel.
Figure 10B:
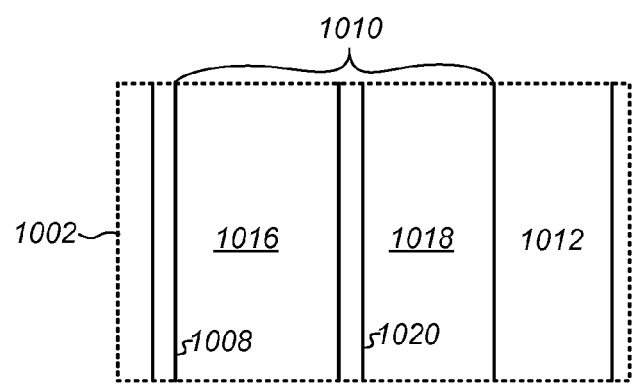

In some embodiments, such as that shown in FIG. 10B, the charge-trapping region 1010 can be a split charge-trapping region including at least a first or inner charge trapping layer 1016 closest to the tunnel oxide 1008, and a second or outer charge trapping layer 1018. Optionally, the first and second charge trapping layers can be separated by an intermediate oxide or anti-tunneling layer 1020.

As with the embodiments described above, either or both of the first charge trapping layer 1016 and the second charge trapping layer 1018 can comprise silicon nitride or silicon oxynitride, and can be formed, for example, by a CVD process including $N_2O/NH_3$ and $DCS/NH_3$ gas mixtures in ratios and at flow rates tailored to provide a silicon-rich and oxygen-rich oxynitride layer.

Finally, either or both of the second charge trapping layer 1018 and the blocking layer 1012 may comprise a high K dielectric, such as HfSiON, HfSiO, HfO, ZrSiON, ZrSiO, ZrO, or $Y_2O_3$.

A suitable thickness for the first charge trapping layer 1016 may be from about 30 Å to about 80 Å (with some variance permitted, for example ±10 A), of which about 5-20 Å may be consumed by radical oxidation to form the anti-tunneling layer 1020. A suitable thickness for the second charge trapping layer 1018 may be at least 30 Å, and a suitable thickness for the blocking dielectric 1012 may be from about 30-70 Å.

The memory device 1000 of FIG. 10A can be made using either a gate first or a gate last scheme. FIG. 11A-F illustrate a gate first scheme for fabricating the non-planar multigate device of FIG. 10A. FIG. 12A-F illustrate a gate last scheme for fabricating the non-planar multigate device of FIG. 10A.

Referring to FIG. 11A, in a gate first scheme a first or lower dielectric layer 1102, such as a blocking oxide, is formed over a first, doped diffusion region 1104, such as a source or a drain, in a substrate 1106. A gate layer 1108 is deposited over the first dielectric layer 1102 to form a control gate of the device, and a second or upper dielectric layer 1110 formed thereover. As with embodiments described above, the first and second dielectric layers 1102, 1110, can be deposited by CVD, radical oxidation or be formed by oxidation of a portion of the underlying layer or substrate. The gate layer 1108 can comprise a metal deposited or a doped polysilicon deposited by CVD. Generally the thickness of the gate layer 1108 is from about 40-50 Å, and the first and second dielectric layers 1102, 1110, from about 20-80 Å.

Referring to FIG. 11B, a first opening 1112 is etched through the overlying gate layer 1108, and the first and second dielectric layers 1102, 1110, to the diffusion region 1104 in the substrate 1106. Next, layers of a tunneling oxide 1114, charge-trapping region 1116, and blocking dielectric 1118 are sequentially deposited in the opening and the surface of the upper dielectric layer 1110 planarize to yield the intermediate structure shown in FIG. 11C.

Although not shown, it will be understood that as in the embodiments described above the charge-trapping region 1116 can include a split charge-trapping region comprising at least one lower or bottom charge-trapping layer closer to the tunnel oxide 1114, and an upper or top charge-trapping layer overlying the bottom charge-trapping layer. Generally, the top charge-trapping layer comprises a silicon-rich, oxygen-lean nitride layer and comprises a majority of a charge traps distributed in multiple charge-trapping layers, while the bottom charge-trapping layer comprises an oxygen-rich nitride or silicon oxynitride, and is oxygen-rich relative to the top charge-trapping layer to reduce the number of charge traps therein. In some embodiments, the split charge-trapping region 1116 further includes at least one thin, intermediate or anti-tunneling layer comprising a dielectric, such as an oxide, separating the top charge-trapping layer from the bottom charge-trapping layer.

Next, a second or channel opening 1120 is anisotropically etched through tunneling oxide 1114, charge-trapping region 1116, and blocking dielectric 1118, FIG. 11D. Referring to FIG. 11E, a semiconducting material 1122 is deposited in the channel opening to form a vertical channel 1124 therein. The vertical channel 1124 can include an annular region in an outer layer of a substantially solid cylinder of semiconducting material, or, as shown in FIG. 11E, can include a separate, layer semiconducting material 1122 surrounding a cylinder of dielectric filler material 1126.

Referring to FIG. 11F, the surface of the upper dielectric layer 1110 is planarized and a layer of semiconducting material 1128 including a second, doped diffusion region 1130, such as a source or a drain, formed therein deposited over the upper dielectric layer to form the device shown.

Figure 12A:
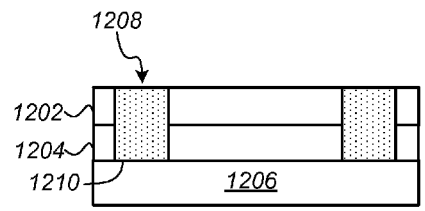
FIG. 12A through 12F illustrate a gate last scheme for fabricating the non-planar multigate device of FIG. 10A.

Referring to FIG. 12A, in a gate last scheme a dielectric layer 1202, such as an oxide, is formed over a sacrificial layer 1204 on a surface on a substrate 1206, an opening etched through the dielectric and sacrificial layers and a vertical channel 1208 formed therein. As with embodiments described above, the vertical channel 1208 can include an annular region in an outer layer of a substantially solid cylinder of semiconducting material 1210, such as a polycrystalline or monocrystalline silicon, or can include a separate, layer semiconducting material surrounding a cylinder of dielectric filler material (not shown). The dielectric layer 1202 can comprise any suitable dielectric material, such as a silicon oxide, capable of electrically isolating the subsequently formed gate layer of the memory device 1000 from an overlying electrically active layer or another memory device. The sacrificial layer 1204 can comprise any suitable material that can be etched or removed with high selectivity relative to the material of the dielectric layer 1202, substrate 1206 and vertical channel 1208.

Figure 12B:
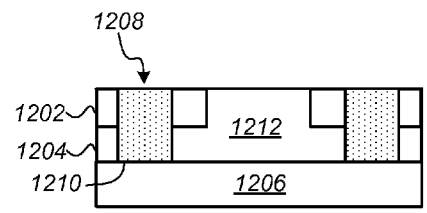

Referring to FIG. 12B, a second opening 1212 is etched through the etched through the dielectric and sacrificial layers 1202, 1204, to the substrate 1106, and the sacrificial layer 1204 etched or removed. The sacrificial layer 1204 can comprise any suitable material that can be etched or removed with high selectivity relative to the material of the dielectric layer 1202, substrate 1206 and vertical channel 1208. In one embodiment the sacrificial layer 1204 comprises that can be removed by Buffered Oxide Etch (BOE etch).

Figure 12C:
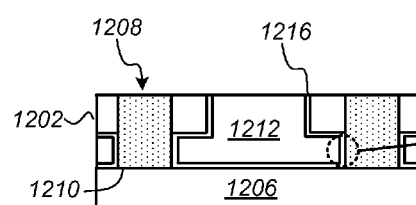
Figure 12D:
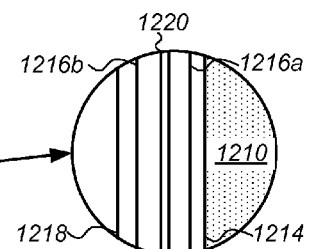

Referring to FIGS. 12C and 12D, layers of a tunneling oxide 1214, charge-trapping region 1216, and blocking dielectric 1218 are sequentially deposited in the opening and the surface of the dielectric layer 1202 planarize to yield the intermediate structure shown in FIG. 12C. In some embodiments, such as that shown in FIG. 12D, the charge-trapping region 1216 can be a split charge-trapping region including at least a first or inner charge trapping layer 1216a closest to the tunnel oxide 1214, and a second or outer charge trapping layer 1216b. Optionally, the first and second charge trapping layers can be separated by an intermediate oxide or anti-tunneling layer 1220.

Figure 12E:
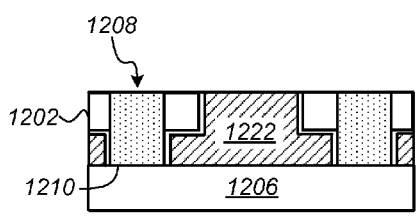
Figure 12F:
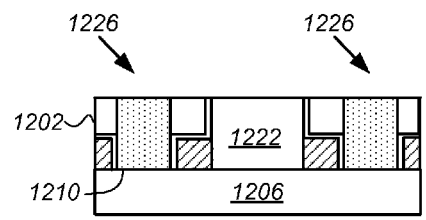

Next, a gate layer 1222 is deposited into the second opening 1212 and the surface of the upper dielectric layer 1202 planarized to yield the intermediate structure illustrated in FIG. 12E. As with embodiments described above, the gate layer 1222 can comprise a metal deposited or a doped polysilicon. Finally, an opening 1224 is etched through the gate layer 1222 to form control gate of separate memory devices 1226.

Thus, a semiconductor structure integrating charge trap memory devices with logic devices and method to form the same has been disclosed. Although the present invention has been described in language specific to structural features or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A method comprising:
   forming in a first region of a substrate a channel of a memory device from a semiconducting material overlying a surface of the substrate, the channel connecting a source and a drain of the memory device;
   forming a charge trapping dielectric stack over the channel adjacent to a plurality of surfaces of the channel, wherein the charge trapping dielectric stack includes a blocking layer on a charge trapping layer over a tunneling layer; and
   forming a MOS device over a second region of the substrate, wherein forming the charge trapping dielectric stack comprises:
      opening a window in a sacrificial dielectric layer with a wet etchant to expose the first region of the substrate;
      forming in the window, the blocking layer on the charge trapping layer over the tunneling layer; and
      wet etching the sacrificial dielectric layer.

2. The method of claim 1, wherein forming the MOS device comprises performing a thermal oxidation to simultaneously form a gate dielectric layer of the MOS device and to thermally reoxidize the blocking layer.

3. The method of claim 2, further comprising performing a nitridation process to nitridize the gate dielectric layer and the blocking layer simultaneously.

4. The method of claim 1, wherein the charge-trapping layer comprises multiple charge-trapping layers including a lower charge-trapping layer comprising a nitride closer to the tunnel oxide, and an upper charge-trapping layer that is oxygen-lean relative to the lower charge-trapping layer and comprises a majority of charge traps distributed in multiple charge-trapping layers.

5. The method of claim 4, further comprising forming a gate dielectric layer over the second region of the substrate, wherein the gate dielectric layer comprises a high K gate dielectric.

6. The method of claim 5, further comprising forming a metal gate layer over the high K gate dielectric.

7. The method of claim 4, wherein the charge-trapping layer further comprises a middle oxide layer separating the upper charge-trapping layer and the lower charge-trapping layer, and wherein the gate dielectric layer comprises a high K gate dielectric.

8. The method of claim 7, further comprising forming a metal gate layer over the high K gate dielectric.

9. The method of claim 7, wherein forming the channel comprises forming the channel from silicon having <100> surface crystalline orientation relative to a long axis of the channel.

10. A method comprising:
    forming in a first region of a substrate a channel of a memory device from a semiconducting material overlying a surface of the substrate, the channel connecting a source and a drain of the memory device;
    forming a charge trapping dielectric stack over the channel adjacent to a plurality of surfaces of the channel, wherein the charge trapping dielectric stack includes a blocking layer on a charge trapping layer over a tunneling layer; and
    forming a MOS device over a second region of the substrate, wherein forming the MOS device comprises performing a thermal oxidation to simultaneously form a gate dielectric layer of the MOS device and to thermally reoxidize the blocking layer, and performing a nitridation process to nitridize the gate dielectric layer and the blocking layer simultaneously.

11. The method of claim 10, wherein the charge-trapping layer comprises multiple charge-trapping layers including a lower charge-trapping layer comprising a nitride closer to the tunnel oxide, and an upper charge-trapping layer that is oxygen-lean relative to the lower charge-trapping layer and comprises a majority of charge traps distributed in multiple charge-trapping layers.

12. The method of claim 11, further comprising forming a gate dielectric layer over the second region of the substrate, wherein the gate dielectric layer comprises a high K gate dielectric.

13. The method of claim 12, further comprising forming a metal gate layer over the high K gate dielectric.

14. The method of claim 11, wherein the charge-trapping layer further comprises a middle oxide layer separating the upper charge-trapping layer and the lower charge-trapping layer, and wherein the gate dielectric layer comprises a high K gate dielectric.

15. The method of claim 14, further comprising forming a metal gate layer over the high K gate dielectric.

16. The method of claim 14, wherein forming the channel comprises forming the channel from silicon having <100> surface crystalline orientation relative to a long axis of the channel.

17. A method comprising:
    forming in a first region of a substrate a channel of a memory device from a semiconducting material overlying a surface of the substrate, the channel connecting a source and a drain of the memory device;
    forming a charge trapping dielectric stack over the channel adjacent to a plurality of surfaces of the channel, wherein the charge trapping dielectric stack includes a blocking layer on a charge trapping layer over a tunneling layer; and
    forming a MOS device over a second region of the substrate,
    wherein forming the charge trapping dielectric stack comprises:
        opening a window in a sacrificial dielectric layer with an etchant to expose the first region of the substrate;
        forming in the window, the blocking layer on the charge trapping layer over the tunneling layer; and
        etching the sacrificial dielectric layer.

18. The method of claim 17, wherein the charge-trapping layer comprises multiple charge-trapping layers including a lower charge-trapping layer comprising a nitride closer to the tunnel oxide, and an upper charge-trapping layer that is oxygen-lean relative to the lower charge-trapping layer and comprises a majority of charge traps distributed in multiple charge-trapping layers.

19. The method of claim 18, wherein the charge-trapping layer further comprises a middle oxide layer separating the upper charge-trapping layer and the lower charge-trapping layer, and wherein the gate dielectric layer comprises a high K gate dielectric.

20. The method of claim 19, wherein forming the channel comprises forming the channel from silicon having <100> surface crystalline orientation relative to a long axis of the channel.

* * * * *